United States Patent
Shiba

(10) Patent No.: US 9,935,054 B2
(45) Date of Patent: Apr. 3, 2018

(54) MARK FORMING METHOD, MARK DETECTING METHOD, AND DEVICE MANUFACTURING METHOD

(71) Applicant: NIKON CORPORATION, Tokyo (JP)

(72) Inventor: Yuji Shiba, Ageo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/863,938

(22) Filed: Sep. 24, 2015

(65) Prior Publication Data
US 2016/0079179 A1 Mar. 17, 2016

Related U.S. Application Data

(63) Continuation of application No. PCT/JP2014/058393, filed on Mar. 25, 2014.

(30) Foreign Application Priority Data

Mar. 27, 2013 (JP) ................. 2013-067696

(51) Int. Cl.
*H01L 23/544* (2006.01)
*G03F 7/20* (2006.01)
(Continued)

(52) U.S. Cl.
CPC .............. *H01L 23/544* (2013.01); *G03F 7/20* (2013.01); *H01L 21/0274* (2013.01);
(Continued)

(58) Field of Classification Search
CPC ....... G03F 7/20; G03F 7/168; H01L 21/0274; H01L 21/3086; H01L 22/12; H01L 23/544; H01L 2223/5442; H01L 2223/54426; H01L 2223/5446; H01L 2924/0002; H01L 21/02118
See application file for complete search history.

(56) References Cited

U.S. PATENT DOCUMENTS

2003/0025890 A1 2/2003 Nishinaga
2007/0242247 A1 10/2007 Shiraishi
(Continued)

FOREIGN PATENT DOCUMENTS

JP 2010-269304 A 12/2010

OTHER PUBLICATIONS

Jun. 24, 2014 International Search Report issued in International Patent Application No. PCT/JP2014/058393.
(Continued)

*Primary Examiner* — Thanh T Nguyen
(74) *Attorney, Agent, or Firm* — Oliff PLC

(57) ABSTRACT

A mark forming method includes: exposing a wafer with a mask image to form first and second resist marks that have different shapes than one another based on a portion of the mask image; applying a polymer layer that contains a block copolymer to the wafer by spin-coating; forming self-assembled regions in the applied polymer layer; selectively removing a portion of the self-assembled regions; and forming first and second wafer marks on the wafer using the first and second resist marks. This makes it possible to form the marks when forming circuit patterns using self-assembly of a block copolymer.

28 Claims, 14 Drawing Sheets

(51) Int. Cl.
*H01L 21/308* (2006.01)
*H01L 21/027* (2006.01)
*H01L 21/66* (2006.01)

(52) U.S. Cl.
CPC .......... *H01L 21/3086* (2013.01); *H01L 22/12* (2013.01); *H01L 2223/5442* (2013.01); *H01L 2223/5446* (2013.01); *H01L 2223/54426* (2013.01); *H01L 2924/0002* (2013.01)

(56) References Cited

U.S. PATENT DOCUMENTS

| | | | |
|---|---|---|---|
| 2010/0092599 A1* | 4/2010 | Selinidis | B82Y 10/00 425/470 |
| 2010/0297847 A1 | 11/2010 | Cheng et al. | |
| 2012/0164389 A1* | 6/2012 | Yang | B82Y 10/00 428/172 |
| 2014/0094015 A1 | 4/2014 | Kasa et al. | |
| 2014/0242799 A1* | 8/2014 | Takakuwa | H01L 21/76802 438/702 |

OTHER PUBLICATIONS

Jun. 24, 2014 Written Opinion issued in International Patent Application No. PCT/JP2014/058393.

* cited by examiner

MARK FORMING METHOD, MARK DETECTING METHOD, AND DEVICE MANUFACTURING METHOD

CROSS-REFERENCE TO RELATED APPLICATIONS

This application is a Continuation Application of International Application No. PCT/JP2014/058393 claiming the conventional priority of Japanese patent Application No. 2013-067696 filed on Mar. 27, 2013 and titled "MARK FORMING METHOD, MARK DETECTING METHOD, AND DEVICE MANUFACTURING METHOD". The disclosures of Japanese patent Application No. 2013-067696 and International Application No. PCT/JP2014/058393 are incorporated herein by reference in their entirety.

TECHNICAL FIELD

The present invention relates to a mark forming technology for forming marks on a substrate, a mark detecting technology for detecting marks formed on a substrate, and a device manufacturing technology that uses the mark forming technology or the mark detecting technology.

BACKGROUND

Semiconductor devices typically include a plurality of layers of circuit patterns formed on top of a substrate. During the process for manufacturing such semiconductor devices, in order to accurately align the plurality of layers of circuit patterns with one another, alignment marks used for positioning or alignment are formed in mark formation regions in a prescribed layer of the substrate. When the substrate is a semiconductor wafer (hereinafter, simply referred to as "wafer"), these alignment marks are also known as wafer marks.

The smallest (finest) circuit patterns in conventional semiconductor devices are formed using a dry lithography or liquid immersion lithography process performed using a dry or immersion-type (liquid immersion-type) exposure device having an exposure wavelength of 193 nm, for example. It has been predicted that formation of circuit patterns smaller (finer) than the 22 nm node, for example, will be difficult even when using conventional optical lithography in combination with the double patterning process being developed more recently.

Recently, methods for forming circuit patterns smaller than the resolution limits of current lithography technologies by producing nanoscale fine structures (sub-lithographic structures) using directed self-assembly of block copolymers within patterns formed using a lithography process have been proposed (see US Patent Application Laid-open No. 2010/0297847 and Japanese Unexamined Patent Application Publication No. 2010-269304A, for example). Patterned block copolymer structures are also known as microdomains (microphase separation domains) or simply as domains.

SUMMARY

Using directed self-assembly of a block copolymer makes it possible to form nanoscale-level circuit patterns in a certain layer of a substrate. Formation of alignment marks in addition to the circuit patterns in that layer may also be required. However, simply forming alignment marks using a conventional method results in the formation of unexpected microstructures in the alignment marks themselves due to the self-assembly of the block copolymer, thereby making it difficult to detect those alignment marks in later processes and potentially causing a reduction in overlay precision between the layers of the substrate.

In light of the foregoing, an object of aspects of the present teaching is to provide a mark forming technology that can be used when forming circuit patterns using self-assembly of a block copolymer.

According to a first aspect, provided is a mark forming method, including: exposing a region, of a substrate, including a mark formation region with a mask image to form a first mark and a second mark in the mark formation region based on a first portion of the mask image, the first mark and the second mark having shapes different than one another; applying a polymer layer containing a block copolymer to the region including the mark formation region; forming self-assembled regions in at least a portion of the applied polymer layer; selectively removing a portion of the formed self-assembled regions; forming a first positioning mark in the mark formation region of the substrate using the first mark; and forming a second positioning mark in the mark formation region of the substrate using the second mark.

According to a second aspect, provided is a mark detecting method for detecting the first and second positioning marks formed in a mark formation region of a substrate using the mark forming method according to the first aspect. The mark detecting method includes: generating detection signals for the first and second positioning marks; evaluating the generated detection signals; and selecting a mark to use for positioning the substrate from the first and second positioning marks based on the evaluation result.

According to a third aspect, provided is a device manufacturing method, including: forming alignment marks for aligning layers on a substrate using the mark forming method according to the first aspect; performing an alignment using the alignment marks and exposing the substrate; and treating the exposed substrate.

BRIEF DESCRIPTION OF THE DRAWING(S)

FIGS. 4A, 4B, 4C, 4D, 4E, 4F, 4G, and 4H are each an enlarged cross-sectional view illustrating a portion of a wafer pattern that gradually changes during a pattern forming process.

Figure 5A:
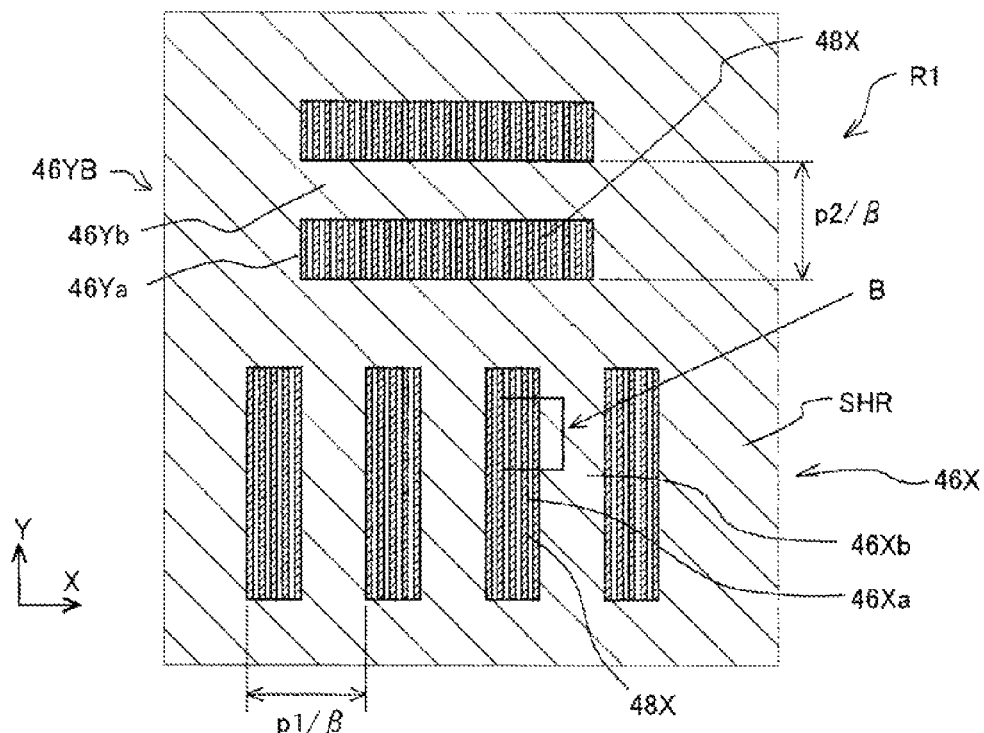
Figure 5B:
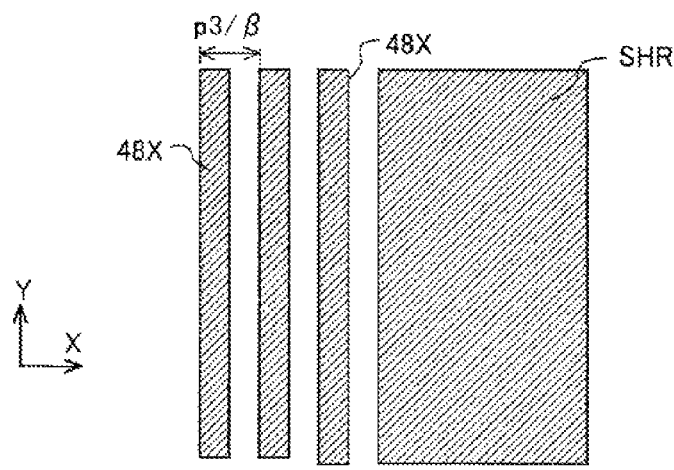

FIG. 5A is an enlarged plan view illustrating a portion of a reticle mark pattern. FIG. 5B is an enlarged plan view of region B in FIG. 5A.

Figure 6A:
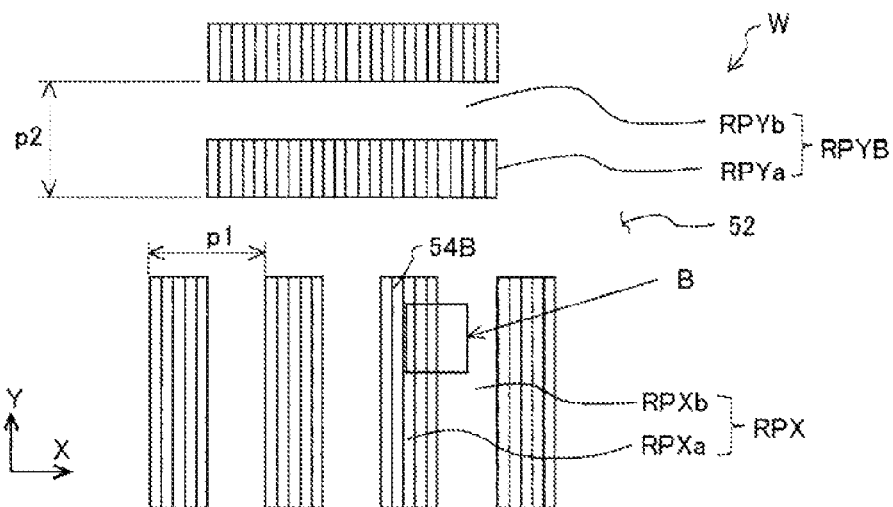
Figures 6B, 6C:
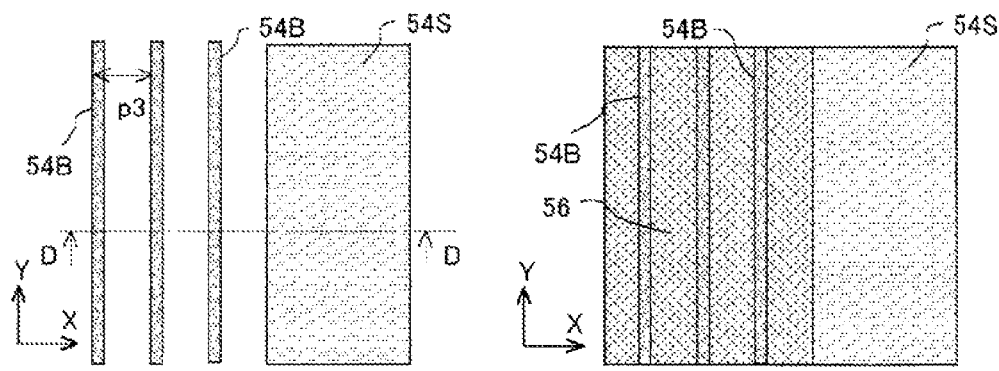

FIG. 6A is an enlarged plan view illustrating a portion of a resist pattern for a first wafer mark. FIGS. 6B and 6C are enlarged plan views illustrating the respective patterns in region B in FIG. 6A during different manufacturing stages.

Figure 7A:
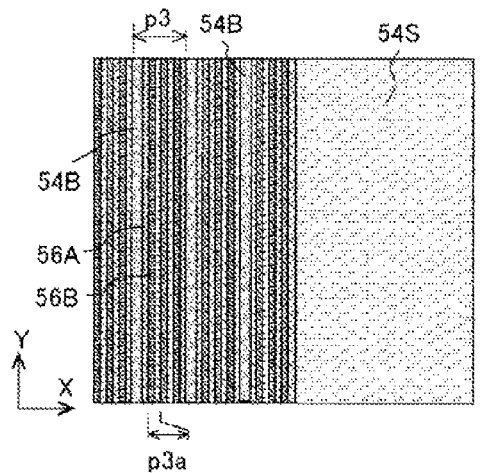
Figure 7B:
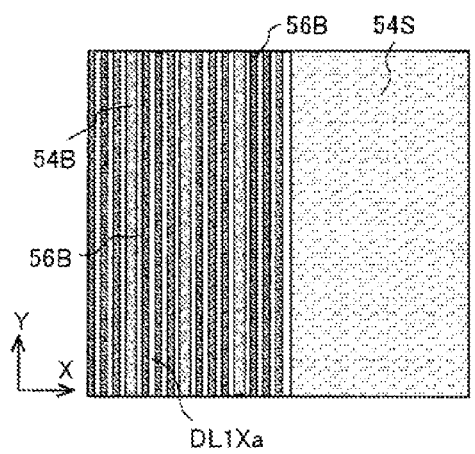
Figure 7C:
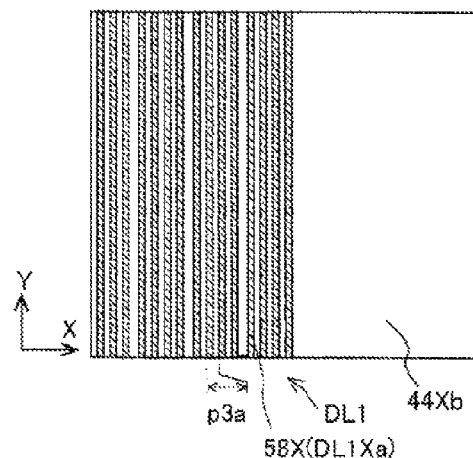

FIGS. 7A, 7B and 7C are enlarged plan views illustrating the respective patterns in region B in FIG. 6A during different manufacturing stages.

Figure 8:
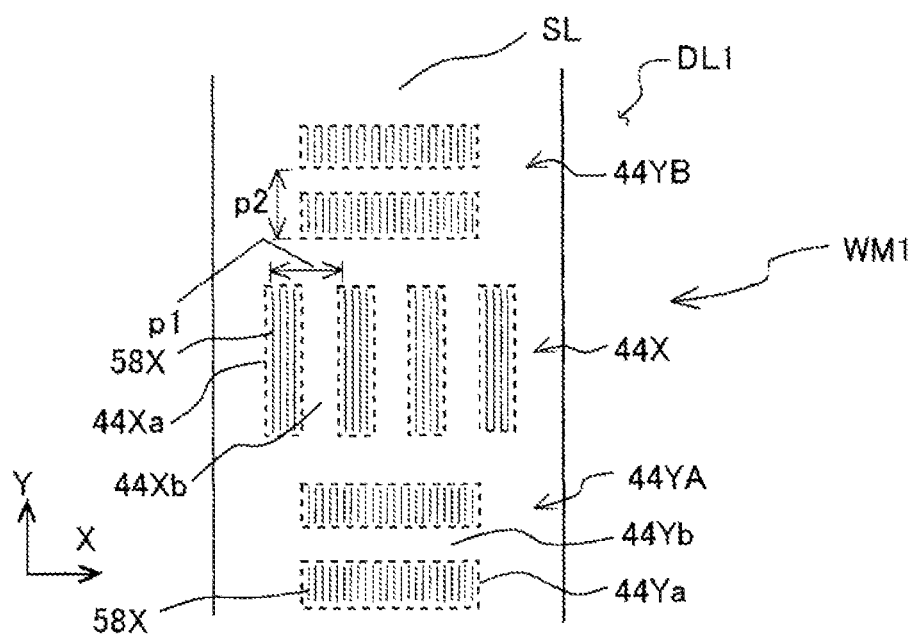

FIG. 8 is an enlarged plan view illustrating a configuration of the first wafer mark formed in an example of the embodiment.

Figure 9A:
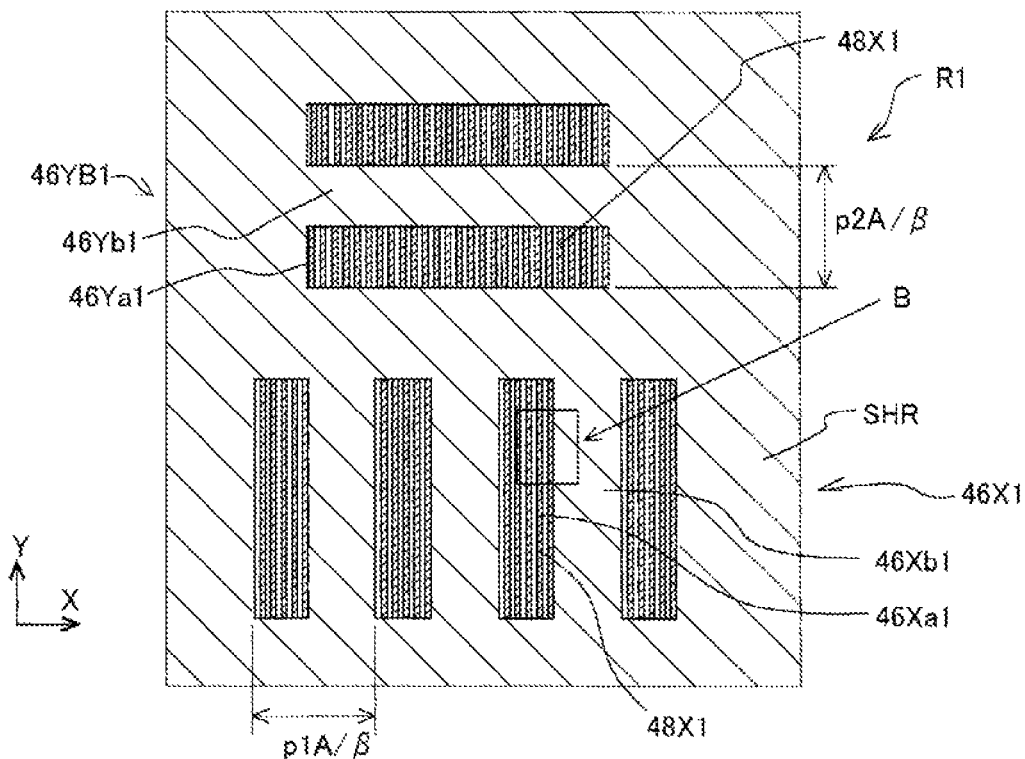
Figure 9B:
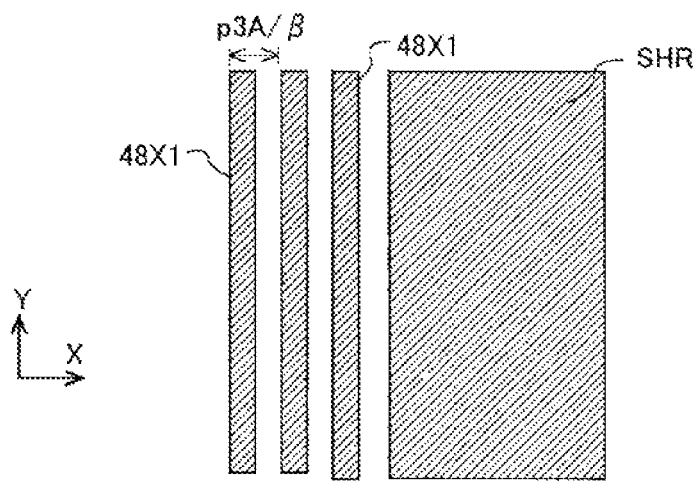

FIG. 9A is an enlarged plan view illustrating a portion of a reticle pattern for a second wafer mark. FIG. 9B is an enlarged view of region B in FIG. 9A.

Figure 10A:
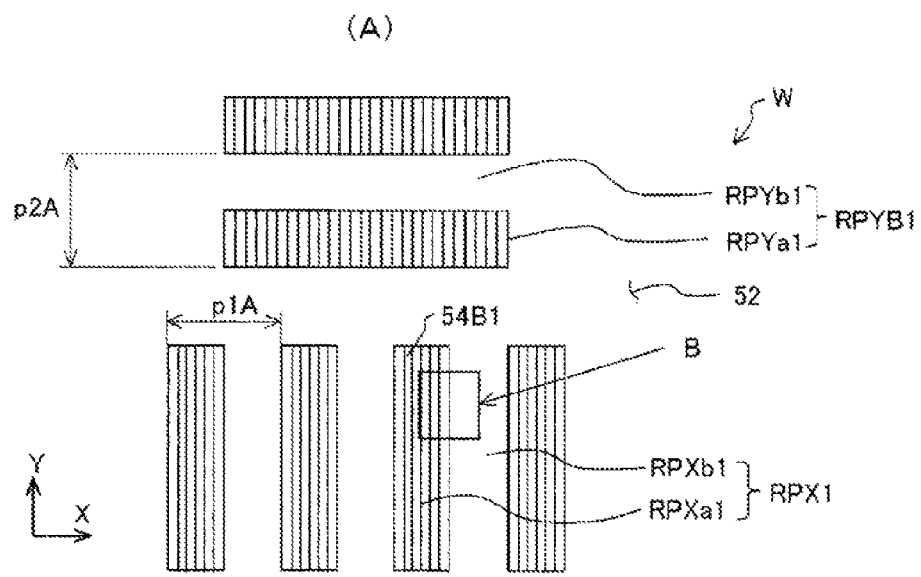
Figures 10B, 10C:
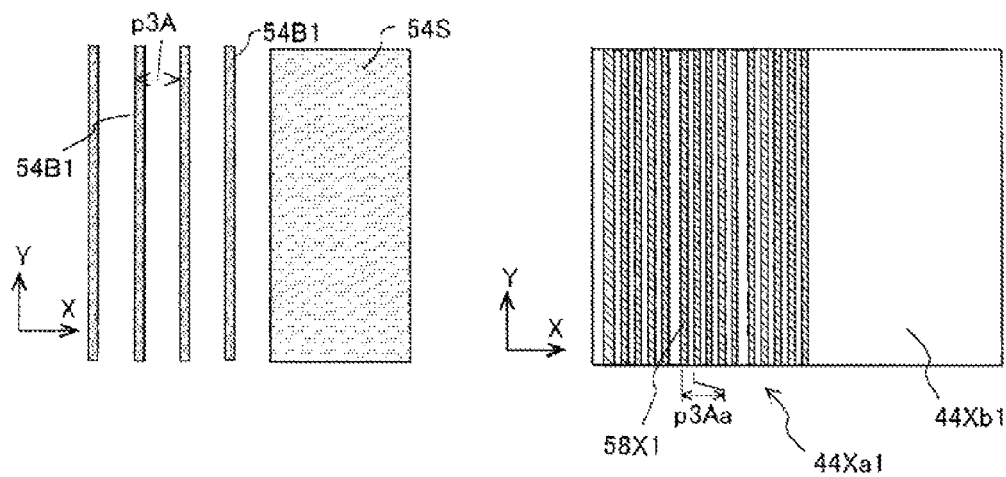

FIG. 10A is an enlarged plan view illustrating a portion of a resist pattern for the second wafer mark. FIGS. 10B and 10C are enlarged plan views illustrating the respective patterns in region B in FIG. 10A during different manufacturing stages.

Figure 11:
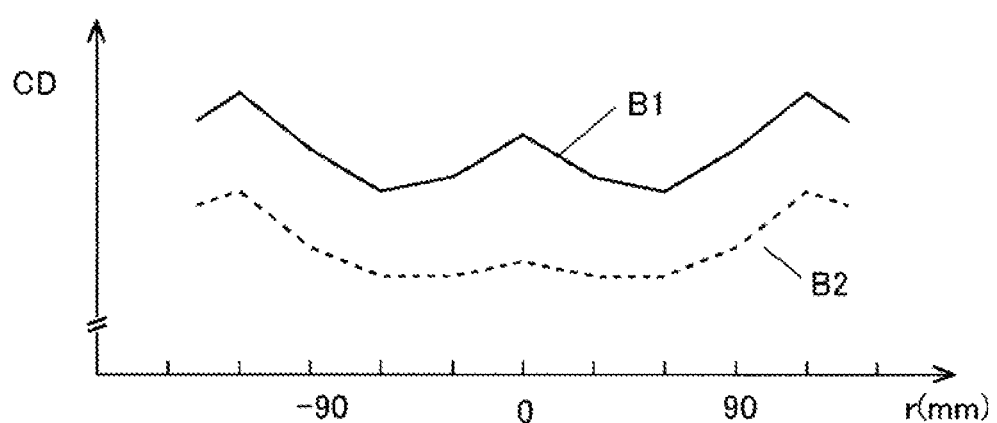

FIG. 11 shows an example of the relationship between the position in the radial direction on the wafer and the shape of wafer marks formed at those positions.

Figure 12A:
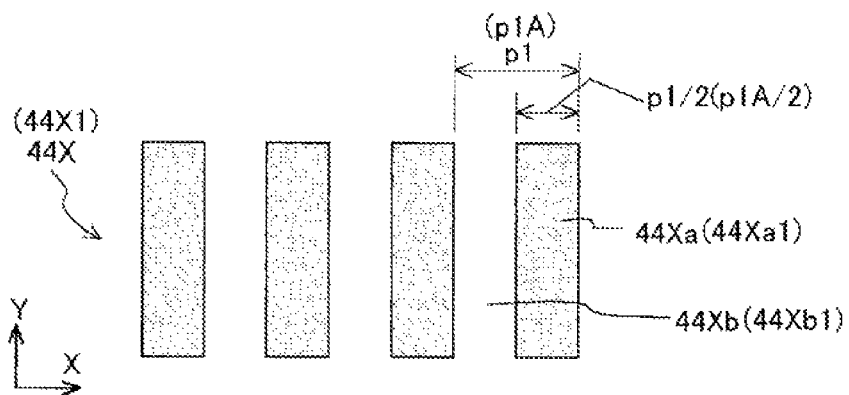
Figure 12B:
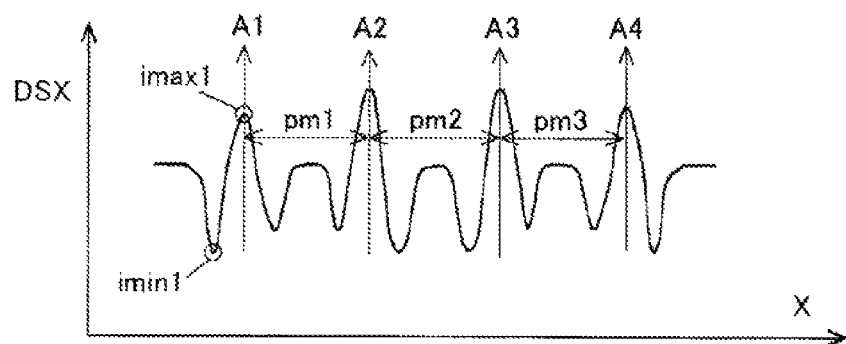
Figure 12C:
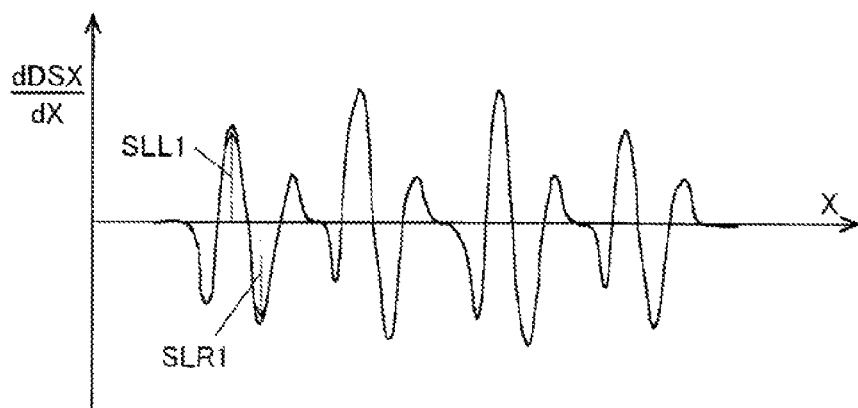

FIG. 12A is an enlarged plan view illustrating a portion of a formed wafer mark. FIG. 12B illustrates an example of an image signal of the image of the mark illustrated in FIG. 12A. FIG. 12C illustrates an example of a differentiated signal of the image signal illustrated in FIG. 12B.

FIGS. 13A, 13B, 13C, and 13D are each an enlarged cross-sectional view illustrating a portion of a wafer pattern that gradually changes during a pattern forming process according to a modification example.

Figure 14:
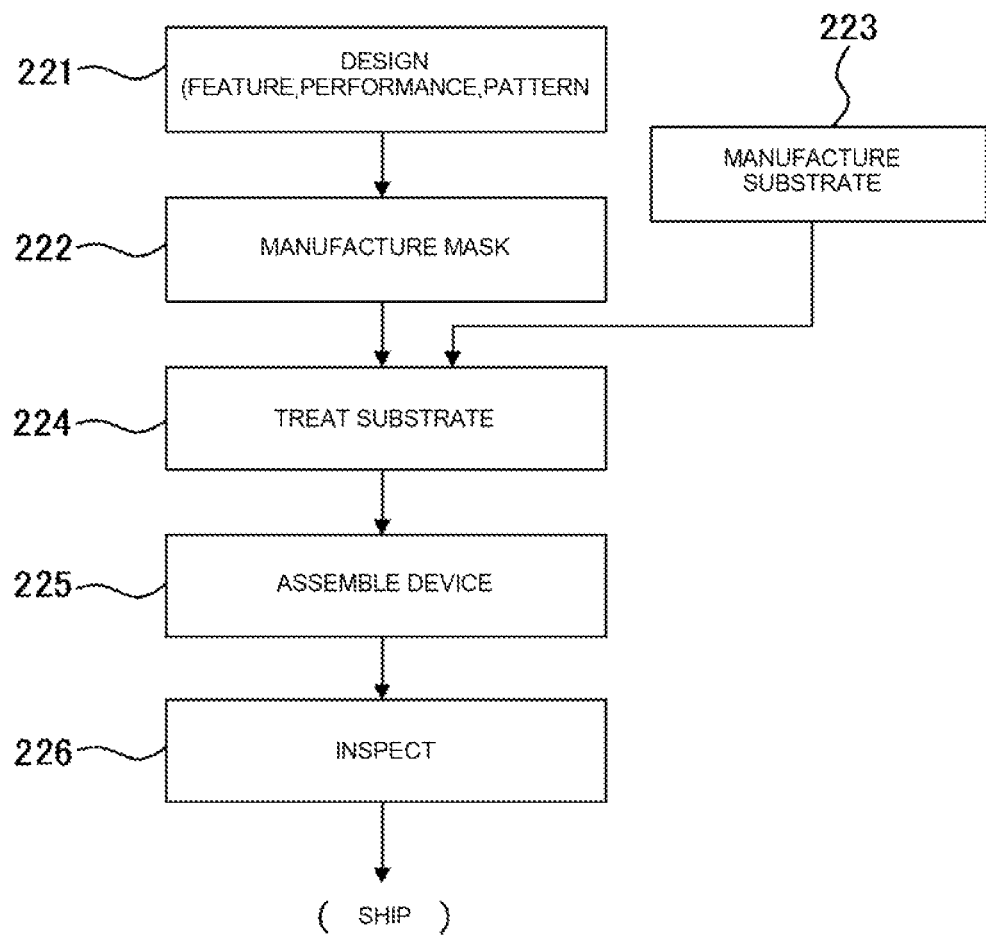

FIG. 14 is a flowchart of an example of a manufacturing process for an electronic device.

EMBODIMENTS

Examples of preferred embodiments of the present teaching will be described with reference to FIGS. 1A to 12C. First, an example of a pattern forming system according to the present embodiment for forming circuit patterns for an electronic device (microdevice) such as a semiconductor device will be described.

Figure 1A:
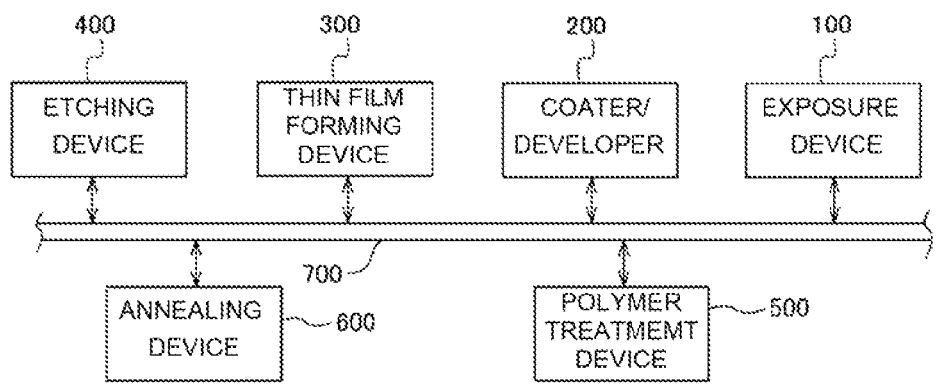
FIG. 1A is a block diagram illustrating the main components of a pattern forming system used in an example of an embodiment.
Figure 1B:
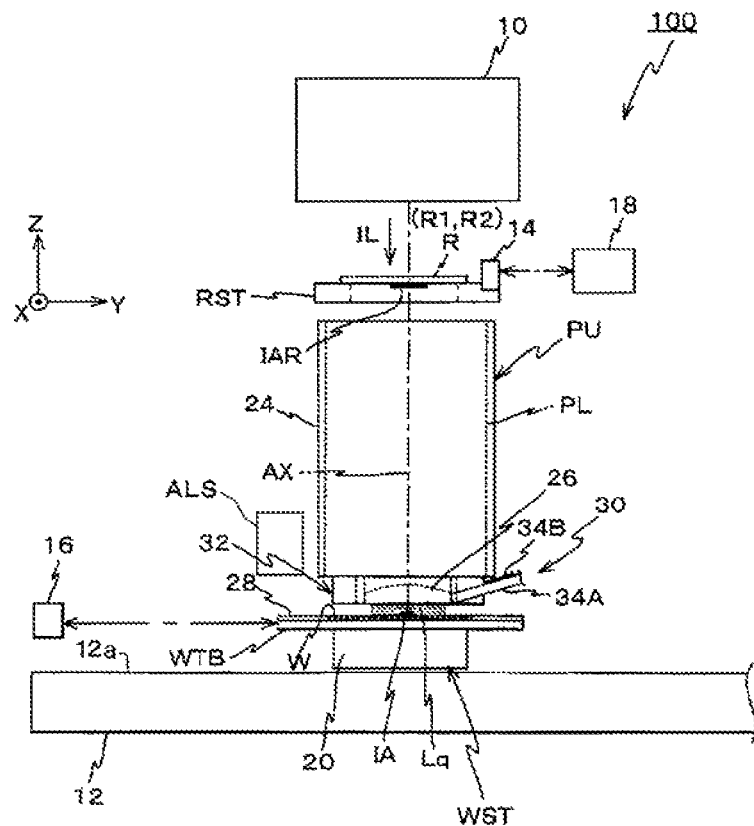
FIG. 1B schematically illustrates a configuration of the exposure device illustrated in FIG. 1A.

FIG. 1A illustrates the main components of the pattern forming system of the present embodiment. FIG. 1B schematically illustrates a configuration of a scanning exposure device (projection exposure device) 100, illustrated in FIG. 1A, including a scanning stepper (scanner). As illustrated in FIG. 1A, the pattern forming system includes: the exposure device 100 that exposes a wafer (a semiconductor wafer) coated with a photosensitive material to light; a coater/developer 200 that coats the wafer with a photoresist (resist) used as the photosensitive material for the wafer and develops the coated wafer; a thin film forming device 300; an etching device 400 that dry or wet etches the wafer; a polymer treatment device 500 that performs a treatment using a polymer that contains a block copolymer (BCP) described below; an annealing device 600; a conveyor system 700 that transports the wafer between these devices; a host computer (not illustrated in the figure); and the like.

The block copolymer used in the present teaching is a polymer that contains at least two monomers that each exist as blocks or a polymer derived from those monomers. Each monomer block contains a repeating chain of that monomer. Any type of polymer such as a diblock copolymer or a triblock copolymer may be used for the block copolymer. Of these, a diblock copolymer has two different monomer blocks. Diblock copolymers can be abbreviated using the notation A-b-B, where A is a first polymer block, B is a second polymer block, and -b- indicates that this polymer is a diblock copolymer that has the blocks A and B. For example, PS-b-PMMA represents a diblock copolymer of polystyrene (PS) and polymethyl methacrylate (PMMA). In addition to chained block copolymers, block copolymers with other structures such as star copolymers, branched copolymers, hyperbranched copolymers, or graft copolymers may be used for the block copolymer of the present teaching.

Moreover, the blocks (monomers) that form the block copolymer tend to assemble (that is, phase separate) to form separate microphase separation domains that are also known as microdomains or simply as domains. This phase separation is one type of self-assembly. The interval between different domains and the shape of the domains depend on the interactions between the different blocks in the block copolymer as well as on the volume percentage and number of each block present. The domains of the block copolymer can be formed as a result of annealing, for example. The heating or baking, which is a portion of the annealing, is a typical process in which the temperature of the substrate and the coating layer (thin film layer) formed thereon is increased to be higher than the ambient temperature. The annealing may include thermal annealing, thermal gradient annealing, solvent vapor annealing, or other annealing methods. Thermal annealing, sometimes called heat curing, is used to induce phase separation and can also be used as a process for reducing or removing defects in the layers of horizontally oriented microphase separation domains. Annealing typically includes heating to a temperature higher than the glass transition temperature of the block copolymer for a certain period of time (several minutes to several days, for example).

Furthermore, in the present embodiment, directed self-assembly (DSA) of the polymer that contains the block copolymer is used to form segmented nanoscale-order domains of a shape suitable for forming circuit patterns and/or alignment marks for a semiconductor device. Directed self-assembly is a technology in which a resist pattern formed using a lithography process, for example, is used as a pre-pattern or guide pattern, and then the spatial configuration (topographical structures) defined by that pre-pattern or guide pattern is used to control the arrangement of the domains of the block copolymer. Directed self-assembly is typically implemented using a grapho-epitaxy process that employs a three-dimensional pre-pattern or guide pattern, for example, but a chemo-epitaxy process in which a planar pre-pattern or guide pattern is formed on the substrate may also be used.

As illustrated in FIG. 1B, the exposure device 100 includes: an illumination system 10; a reticle stage RST that holds a reticle R (a mask) illuminated by the illumination light (exposure light) IL for exposure from the illumination system 10; a projection unit PU that includes a projection optical system PL that projects the illumination light IL emitted from the reticle R onto the surface of a wafer W (a substrate); a wafer stage WST that holds the wafer W; a main control unit (not illustrated in the figure) such as a computer that controls the overall operation of the overall device; and the like. The descriptions that follow use the coordinate system illustrated in FIG. 1B, in which the Z axis is parallel to the optical axis AX of the projection optical system PL, the Y axis is defined within a plane orthogonal to the Z axis (a substantially horizontal plane) and is parallel to the direction in which the reticle R and the wafer W are scanned relative to one another, the X axis is parallel to a direction mutually orthogonal to the Z and Y axes, and directions of rotation (inclination) around the X, Y, and Z axes are the θx, θy, and θz directions, respectively.

As disclosed in the specification of US Patent Application Laid-open No. 2003/025890, for example, the illumination system 10 includes a light source that generates the illumination light IL and an illumination optical system that illuminates the reticle R with illumination light IL. ArF excimer laser light (having a wavelength of 193 nm) is used as the illumination light IL, for example. Moreover, KrF excimer laser light (wavelength 248 nm), harmonics from a YAG laser or a solid-state laser (such as a semiconductor laser), or the like may also be used for the illumination light IL.

The illumination optical system includes: a polarization control optical system; an intensity distribution-forming optical system (such as a diffractive optical element or a spatial light modulator); an illumination equalizing optical system that includes an optical integrator (such as a fly-eye lens or a rod integrator (an internal reflection integrator)) or the like; a reticle blind (a fixed or movable field diaphragm); and the like (note that none of these components are illustrated in the figure). The illumination system 10 illuminates a long, narrow, slit-shaped illumination region IAR that extends in the X direction and is defined on the pattern surface (bottom surface) of the reticle R by the reticle blind with illumination light IL having a prescribed polarization and a substantially uniform intensity distribution using an illumination condition such as dipole illumination, quadrupole illumination, annular illumination, or normal illumination.

Furthermore, the reticle stage RST that holds the reticle R using vacuum suction or the like is placed on the top surface of a reticle base (not illustrated in the figure) that is parallel to the XY plane such that the reticle stage RST can be moved at a fixed (constant) speed in the Y direction and such that the position of the reticle stage RST in the X and Y directions as well as the angle of rotation of the reticle stage RST in the θz direction can be adjusted. The positional information of the reticle stage RST is continuously detected to a resolution of 0.5 to 0.1 nm, for example, through a movable mirror 14 (or a side surface of the stage to which a mirror finishing treatment has been applied) using a reticle interferometer 18 that includes a multi-axis laser interferometer. The position and speed of the reticle stage RST are controlled by controlling, on the basis of the measurements from the reticle interferometer 18, a reticle stage drive system (not illustrated in the figure) that includes a linear motor or the like.

Moreover, the projection unit PU arranged beneath the reticle stage RST includes a lens barrel 24 and a projection optical system PL that includes a plurality of optical elements held in a prescribed positional relationship inside of the lens barrel 24. The projection optical system PL is a bi-telecentric system, for example, and has a prescribed projection magnification β (a reduction ratio such as 1/4 times or 1/5 times). The illumination light IL passes through the reticle R and the projection optical system PL, and the resulting image of the circuit pattern inside the illumination region IAR of the reticle R is formed in an exposure region 1A (a region conjugate to the illumination region IAR) inside a single shot region on the wafer W. The wafer (semiconductor wafer) W used as the substrate in the present embodiment includes, for example, a wafer in which a thin film (such as an oxide film, a metal film, or a polysilicon film) for forming patterns is formed on the surface of a disk-shaped base material made from silicon (or a silicon on insulator (SOI) material or the like) with a diameter of 200 to 450 mm. Furthermore, the surface of the wafer W to be exposed is coated with photoresist with a prescribed thickness (several tens of nm to approximately 200 nm, for example).

Furthermore, in order to perform immersion exposure, the exposure device 100 includes a nozzle unit 32 formed surrounding the periphery of the bottom end of the lens barrel 24 that holds an end lens 26 that is the optical element of the projection optical system PL that is closest to the imaging plane (wafer W). The nozzle unit 32 is part of a local immersion device 30 that supplies a liquid Lq between the end lens 26 and the wafer W. A liquid Lq supply port of the nozzle unit 32 is connected via a supply passage and a supply pipe 34A to a liquid supply device (not illustrated in the figure). A liquid Lq recovery port of the nozzle unit 32 is connected via a recovery passage and a recovery pipe 34B to a liquid recovery device (not illustrated in the figure). A detailed configuration for the local immersion device 30 is disclosed in the specification of US Patent Application Laid-open No. 2007/242247, for example.

Moreover, the wafer stage WST is placed on the top surface 12a of a base plate 12 that is parallel to the XY plane such that the wafer stage WST can be moved in the X, Y, and θz directions. The wafer stage WST includes a stage body 20, a wafer table WTB placed on the top surface of the stage body 20, and a Z leveling mechanism that is provided inside of the stage body 20 and controls the position of the wafer table WTB (wafer W) in the Z direction (Z position) relative to the stage body 20 as well as the tilt angles of the wafer table WTB in the θx and θy directions relative to the stage body 20. The wafer table WTB includes a wafer holder (not illustrated in the figure) that holds the wafer W on a suction surface that is substantially parallel to the XY plane using vacuum suction or the like. A flat-shaped plate (liquid-repellent plate) 28 is formed around the wafer holder (wafer W) on the top surface of the wafer table WTB. The surface of the plate 28, which is substantially flush with the surface of the wafer W (wafer surface), undergoes a liquid-repelling treatment so as to repel the liquid Lq. Furthermore, during exposure, the Z leveling mechanism of the wafer stage WST is driven according to measurements from an oblique incident type autofocus sensor (not illustrated in the figure), for example, such that the wafer surface is in focus with the imaging plane of the projection optical system PL.

Furthermore, reflective surfaces are formed on the end faces of the wafer table WTB in the X and Y directions by applying a mirror finishing treatment thereto. A multi-axis laser interferometer which constitutes a wafer interferometer 16 emits interferometer beams to the reflective surfaces (which may also be movable mirrors) respectively, to measure the positional information of the wafer stage WST (which includes at least the position in the X and Y directions and the angle of rotation in the θz direction) to a resolution of approximately 0.5 to 0.1 nm, for example. The position and speed of the wafer stage WST are controlled by controlling, on the basis of these measurements, a wafer stage drive system (not illustrated in the figure) that includes a linear motor or the like. The positional information of the wafer stage WST may also be measured using an encoder detection device that includes a diffraction grating scale and a detection head.

The exposure device 100 also includes: a wafer alignment system ALS including an image processing-type field image alignment (FIA) system that measures the position of prescribed wafer marks (alignment marks) on the wafer W; and a spatial image measuring system (not illustrated in the figure) that is built into the wafer stage WST for measuring the position of an image of an alignment mark of the reticle R that is projected by the projection optical system PL. The reticle R is aligned with each shot region on the wafer W using this spatial image measuring system (reticle alignment system) and this wafer alignment system ALS.

During exposure of the wafer W, the wafer stage WST is moved (stepped) in the X and Y directions to move the target exposure shot region of the wafer W to a position before the exposure region IA. Furthermore, the local immersion device 30 supplies the liquid Lq between the projection optical system PL and the wafer W. Next, while the projection optical system PL projects an image of a portion of the pattern of the reticle R onto one of the shot regions of the wafer W, the reticle stage RST and the wafer stage WST simultaneously (synchronously) move the reticle R and the wafer W in the Y direction to scan and expose the image of the pattern of the reticle R onto that shot region. The scan and exposure as well as the stepwise movement is repeated to expose the image of the pattern of the reticle R onto each of the shot regions of the wafer W using a step-and-scan immersion technique.

Next, a pattern for a device to be manufactured in the present embodiment such as a gate cell circuit pattern for a static RAM (SRAM) semiconductor device is formed using directed self-assembly (DSA) of a polymer that contains a block copolymer. Furthermore, in the present embodiment, wafer marks that serve as alignment marks used for positioning and alignment are formed in the device layer of the wafer W in which these device patterns are formed.

Figure 2A:
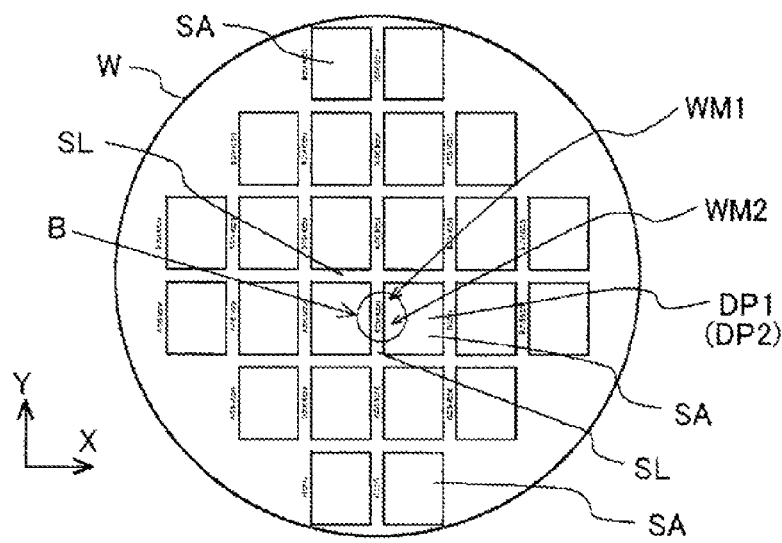
FIG. 2A is a plan view illustrating a device layer formed on a wafer in an example of an embodiment.

FIG. 2A illustrates a wafer W in which these device patterns and wafer marks are formed. As illustrated in FIG. 2A, a large number of shot regions SA (device pattern formation regions) are formed on the surface of the wafer W and separated in the X and Y directions by scribe line regions SL (mark formation regions) of a prescribed width. A device pattern DP1 is formed inside each shot region SA. In the scribe line regions SL around each shot region SA, first and second wafer marks WM1 and WM2 having mutually different shapes are formed. When the diameter of the wafer W is 300 mm, for example, approximately 100 shot regions SA can be formed on the surface of the wafer W. Note that the diameter of the wafer is not limited to 300 mm, and a larger wafer such as a 450 mm wafer may also be used.

Figure 2B:
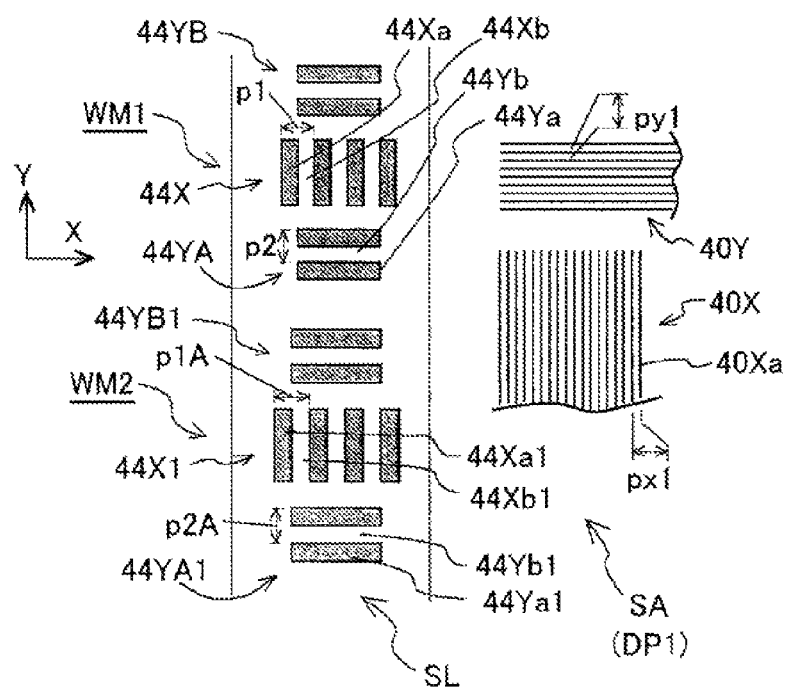
FIG. 2B is an enlarged plan view illustrating a plurality of wafer marks formed around one of the shot regions illustrated in FIG. 2A as well as a portion of a circuit pattern formed in that shot region.

FIG. 2B is an enlarged view of region B in FIG. 2A. As illustrated in FIG. 2B, the device pattern DP1 includes: a line-and-space pattern (hereinafter, simply referred to as "L&S pattern") 40X in which a plurality of line patterns 40Xa that run in the Y direction are arranged in the X direction with a period (pitch) of substantially px1; and an L&S pattern 40Y in which a plurality of line patterns that run in the X direction are arranged in the Y direction with a pitch of substantially py1. The line patterns 40Xa and the like are made from a metal, for example, and the line width thereof is less than or equal to approximately one half of the pitch px1 or the like. In one example, the pitches px1 and py1 are substantially equal, and the pitch px1 is one severalth of the smallest pitch (hereinafter, referred to as "pitch pmin") that can be achieved using a 193 nm immersion lithography process in combination with a so-called double patterning process, for example. One half of the pitch px1 is less than approximately 22 nm, for example. In a case that these L&S patterns 40X and 40Y that have a small pitch are formed, line-shaped domains are formed for each different block when the polymer that contains a block copolymer undergoes directed self-assembly.

Furthermore, each first wafer mark WM1 formed in the scribe line regions SL includes: an X axis wafer mark 44X in which long, thin line pattern regions 44Xa and space pattern regions 44Xb that run in the Y direction and have approximately the same width in the X direction are arranged in the X direction with a pitch p1; and two Y axis wafer marks 44YA and 44YB in which long, thin line pattern regions 44Ya and space pattern regions 44Yb that run in the X direction and have approximately the same width in the Y direction are arranged in the Y direction with a pitch p2. In one example, the wafer marks 44YA and 44YB are arranged on either side of the wafer mark 44X in the Y direction. Similarly, each second wafer mark WM2 formed in the scribe line regions SL includes: an X axis wafer mark 44X1 in which long, thin line pattern regions 44Xa1 and space pattern regions 44Xb1 that run in the Y direction are arranged in the X direction with a pitch p1A; and two Y axis wafer marks 44YA1 and 44YB1 in which long, thin line pattern regions 44Ya1 and space pattern regions 44Yb1 that run in the X direction are arranged in the Y direction with a pitch p2A.

In one example, the pitches p1 and p2 are equal to one another. Moreover, the pitches p1A and p2A are equal to one another. The pitches p1 and p1A are approximately several times to several tens of times larger than the resolution limit (pitch) of 193 nm immersion lithography. In the present embodiment, the pitch p1A is set larger than the pitch p1 by approximately several percent to several tens of percent, for example. Moreover, as described below, microstructures are formed in the line pattern regions 44Xa and 44Xa1 using directed self-assembly of the block copolymer. When different microstructures are formed in the line pattern regions 44Xa and 44Xa1, the pitches p1A and p1 may be equal or approximately equal.

Furthermore, it is sufficient that the line pattern regions 44Xa, 44Ya, 44Xa1, and 44Ya1 of the wafer marks WM1 and WM2 and the space pattern regions 44Xb, 44Yb, 44Xb1, and 44Yb1 of the wafer marks WM1 and WM2 are regions which exhibit different reflectance of the detection light used by the wafer alignment system ALS illustrated in FIG. 1B. In this case, when the wafer alignment system ALS uses a detection light wavelength λa and the objective optical system uses a numerical aperture NA, the resolution limit (optical detection limit) of the wafer alignment system ALS is λa/(2NA). Moreover, in order for the wafer alignment system ALS to detect the wafer marks 44X, 44YA, 44X1, 44YA1, and the like, dividing the values of the pitches p1 and p1A of the wafer marks 44X and 44X1 in half must yield values greater than or equal to this resolution limit. The conditions for the wafer alignment system ALS to be able to detect the wafer marks 44X, 44YA, 44X1, 44YA1, and the like are given below.

$$p1/2 \geq \lambda a/(2NA) \text{ and } p1A/2 \geq \lambda a/(2NA) \qquad (1)$$

For example, if the wavelength λa is 600 nm and the numerical aperture NA is 0.9, the pitches p1 and p1A may be set to values greater than or equal to approximately 670 nm. In the present embodiment, it must be taken into consideration that because line-shaped domains are formed due to directed self-assembly when forming the device pattern DP1, line-shaped domains will also be formed due to directed self-assembly of the block copolymer when forming the wafer marks 44X, 44X1, and the like.

Next, one example of a pattern forming method that uses the pattern forming system of the present embodiment to form the wafer marks WM1 and WM2 illustrated in FIG. 2B will be described with reference to the flowchart in FIG. 3. Note that the following description focuses primarily on the process for forming the wafer mark 44X of the first wafer mark WM1, but the wafer marks 44YA and 44YB of the first wafer mark WM1 as well as the second wafer mark WM2 and the device pattern DP1 are formed at the same time as this process. In one example, as illustrated in FIG. 4A, the surface of a base material 50 of the wafer W made from silicon or the like is used as a first device layer DL1 in which the wafer marks and the device patterns are formed.

Figure 3:
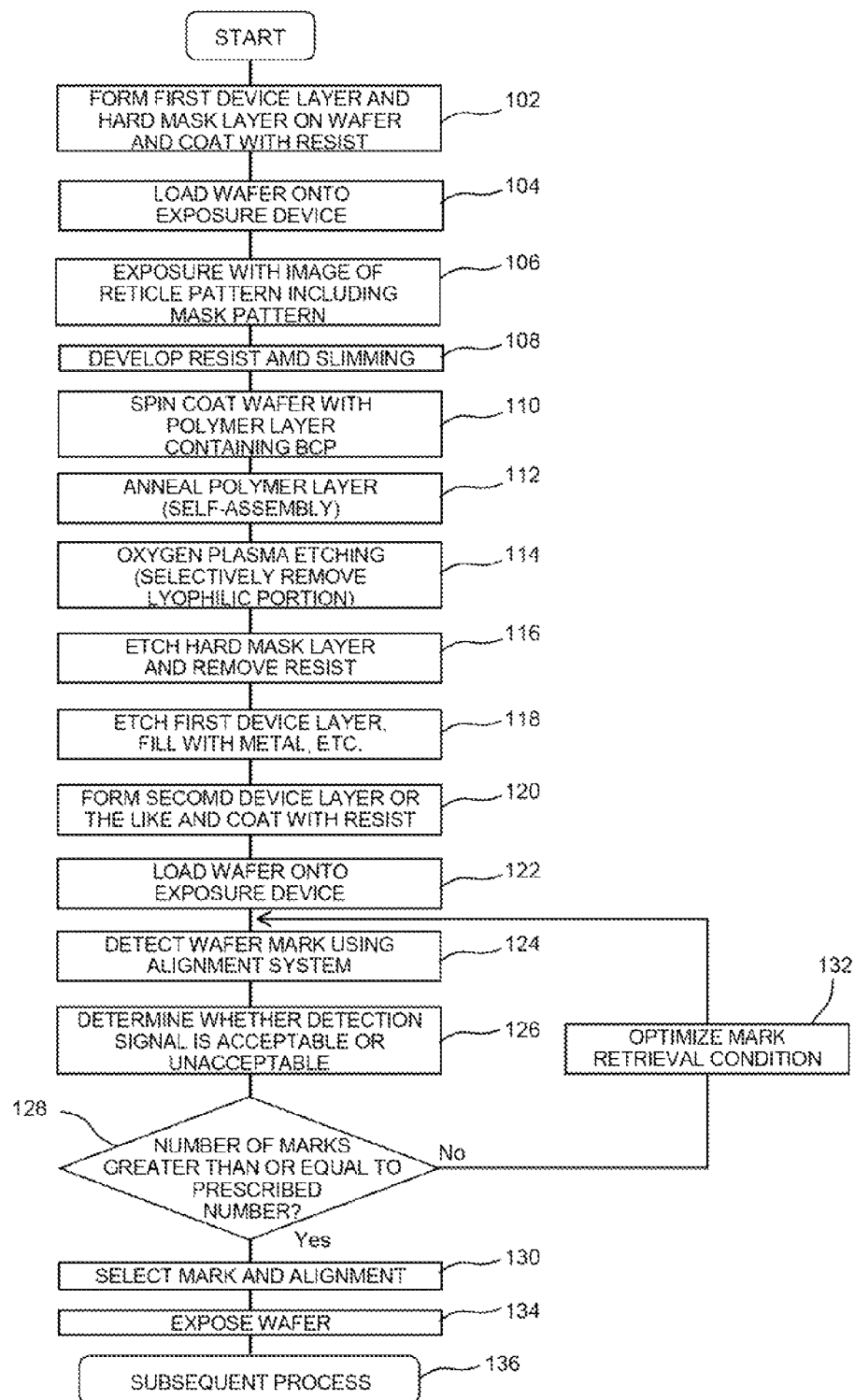
FIG. 3 is a flowchart of a pattern forming method in an example of the embodiment.
Figure 4A:
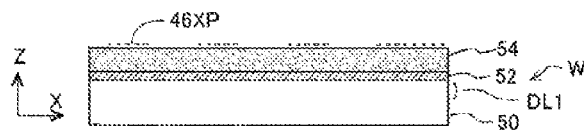
Figure 4B:
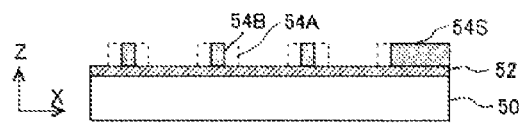
Figure 4C:
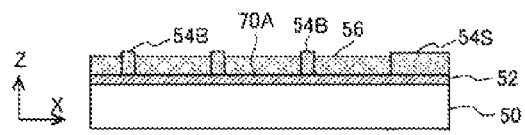

First, in step 102 in FIG. 3, a hard mask layer 52 made from an oxide film, a nitride film, or the like is formed on the surface of the device layer DL1 of the wafer W using the thin film forming device 300. A neutral layer (not illustrated in the figure) may also be formed on top of the hard mask layer 52 to make it easier to form a polymer layer that contains the block copolymer which is described below. Next, the surface of the hard mark layer 52 is coated with a positive resist layer 54, for example, using the coater/developer 200 (see FIG. 4A). Note that a bottom anti-reflection coating (BARC) may also be used for the hard mask layer 52. Next, a reticle (a reticle R1) in which the pattern for the device layer DL1 is formed is loaded into the reticle stage RST of the exposure device 100, the illumination condition of the exposure device 100 is set to quadrupole illumination, for example, so that the smallest (finest) patterns can be exposed in the X and Y directions, and the wafer W is loaded onto the wafer stage WST (step 104). Next, each shot region SA of the wafer W is exposed with the image (not illustrated in the figure) of the device pattern formed in the reticle R using an immersion method. Furthermore, while exposing each shot region SA, the scribe line regions SL around each shot region SA are exposed with an image 46XP, or the like, of a wafer mark pattern formed in the reticle R1 (step 106). The exposed wafer is then unloaded, and the resist is developed in the coater/developer 200 to form a resist pattern 54A (see FIG. 4B). Then, a slimming and resist hardening treatment is applied to the resist pattern 54A (step 108). Note that during exposure with the image of the pattern formed in the reticle R1, the exposure amount can also be increased to narrow the line width of the resist pattern, thereby making it possible to omit the slimming treatment.

As illustrated in FIG. 5A, X axis and Y axis mark patterns 46X and 46YB that are the originals for the first wafer mark WM1 are formed in pattern regions of the reticle R1 corresponding to the scribe line regions SL. The mark patterns 46X and 46YB include line regions 46Xa and 46Ya that correspond to the line pattern regions 44Xa and 44Ya illustrated in FIG. 2B, respectively, as well as space regions 46Xb and 46Yb made from a light-shielding film SHR that correspond to the space pattern regions 44Xa and 44Ya, respectively, and the line regions 46Xa and the space regions 46Xb are arranged in the X direction with pitch p1/β, and the line regions 46Ya and the space regions 46Yb are arranged in the Y direction with pitch p2/β (where β is the projection magnification). The width of the line regions 46Xa and 46Ya is substantially equal to the width of the space regions 46Xb and 46Yb. Also, for convenience, the description that follows assumes that the image of the reticle pattern projected by the projection optical system PL is an upright image.

In the line regions 46Xa and 46Ya, a plurality of long, thin line patterns 48X that run in the Y direction and are made from light-shielding films are formed on a light transmissive background and arranged in the X direction with a pitch p3/β (see FIG. 5B, which is an enlarged view of region B in FIG. 5A). The line width of the line patterns 48X is one half of the corresponding pitch p3/β. In the present embodiment, the pitch p3/β is slightly larger than the resolution limit on the object surface side of the projection optical system PL of the exposure device 100 (the resolution limit of 193 nm immersion lithography). As a result, the exposure device 100 allows the scribe line regions SL of the wafer W to be exposed with the image 46XP and the like of the mark patterns 46X and 46YB of the reticle R1 (which each include a plurality of the line patterns 48X) with high precision.

FIG. 6A illustrates X axis and Y axis resist marks RPX and RPYB made from resist patterns formed on the hard mask layer 52 of the wafer W after the resist layer 54 is exposed with the image of the mark patterns 46X and 46YB of the reticle R1 illustrated in FIG. 5A, developed, and slimmed. As illustrated in FIG. 6A, the resist marks RPX and RPYB include line regions RPXa and RPYa that correspond to the line regions 46Xa and 46Ya of the reticle R1 illustrated in FIG. 5A, respectively, as well as space regions RPXb and RPYb that correspond to the space regions 46Xb and 46Yb, and the line regions RPXa and the space regions RPXb are arranged in the X direction with pitch p1 and the line regions RPYa and the space regions RPYb are arranged in the Y direction with pitch p2. Moreover, FIG. 6B is an enlarged view of region B in FIG. 6A. FIG. 6C and FIGS. 7A to 7C are also enlarged views of regions each corresponding to region B in FIG. 6A.

The space regions RPXb and RPYb (here, the regions surrounding the line regions RPXa and RPYa) are resist film portions 54S (protrusion regions) (See, FIG. 6B). In the line regions RPXa and RPYa, a plurality of long, thin line-shaped protrusion patterns (hereinafter, referred to as "guide patterns") 54B that run in the Y direction and are arranged in the X direction with a pitch p3 are formed. The line width of the guide patterns 54B is one severalth to one several tenth of the pitch p3 (a value slightly larger than the resolution limit in terms of a pitch in 193 nm immersion lithography), for example (see FIG. 4B). Note that FIGS. 4A to 4H are cross-sectional views of a cross section taken along line DD in FIG. 6B.

Moreover, as illustrated in FIG. 9A, X axis and Y axis mark patterns 46X1 and 46YB1 that are the originals for the second wafer mark WM2 are formed in regions near the original patterns for the first wafer mark WM1 in the reticle R1. The mark patterns 46X1 and 46YB1 include line regions 46Xa1 and 46Ya1 that correspond to the line pattern regions 44Xa1 and 44Ya1 illustrated in FIG. 2B, respectively, as well as space regions 46Xb1 and 46Yb1 made from a light-shielding film SHR that correspond to the space pattern regions 44Xa1 and 44Ya1, and the line regions 46Xa1 and the space regions 46Xb1 are arranged in the X direction with pitch p1A/β and the line regions 46Ya1 and the space regions 46Yb1 are arranged in the Y direction with pitch p2A/β (where β is the projection magnification). The width of the line regions 46Xa1 and 46Ya1 is substantially equal to the width of the space regions 46Xb1 and 46Yb1.

In the line regions 46Xa1 and 46Ya1, long, thin line patterns 48X1 that run in the Y direction and are made from a light-shielding film are formed on a light transmissive background and arranged in the X direction with a pitch p3A/β (see FIG. 9B, which is an enlarged view of region B in FIG. 9A). The line width of the line patterns 48X1 is one half of the corresponding pitch p3A/β. In the present embodiment, the pitch p3A/β is substantially equal to the resolution limit on the object surface side of the projection optical system PL of the exposure device 100 (the resolution limit of 193 nm immersion lithography). Moreover, the pitch p3A/β of the line patterns 48X1 is set to a value less than the pitch p3/β of the line patterns 48X illustrated in FIG. SB for the first wafer mark WM1. The exposure device 100 also allows the scribe line regions SL of the wafer W to be exposed with the image of the mark patterns 46X1 and 46YB1 of the reticle R1 (which each include a plurality of the line patterns 48X1) with high precision.

FIG. 10A illustrates X axis and Y axis resist marks RPX1 and RPYB1 formed on the hard mask layer 52 of the wafer W after the resist layer 54 is exposed with the image of the mark patterns 46X1 and 46YB1 of the reticle R1 illustrated in FIG. 9A, developed, and slimmed. As illustrated in FIG. 10A, the resist marks RPX1 and RPYB1 include line regions RPXa1 and RPYa1 that correspond to the line regions 46Xa1 and 46Ya1 of the reticle R1 illustrated in FIG. 9A, respectively, as well as space regions RPXb and RPYb that correspond to the space regions 46Xb1 and 46Yb1, and the line regions RPXa1 and the space regions RPXb1 are arranged in the X direction with pitch p1A and, the line regions RPYa1 and the space regions RPYb1 are arranged in the Y direction with pitch p2A. Moreover. FIGS. 10B and 10C are enlarged views of region B in FIG. 10A, and a region corresponding to the region 8, respectively.

The space regions RPXb1 and RPYb1 are resist film portions 54S (protrusion regions) (See, FIG. 10B). In the line regions RPXa1 and RPYa1, a plurality of long, thin line-shaped protrusion patterns (hereinafter, referred to as "guide patterns") 54B1 that run in the Y direction are formed in the X direction with a pitch p3A. The line width of the guide patterns 54B1 is one severalth to one several tenth of the pitch p3A (which is approximately equal to the resolution limit in terms of a pitch in 193 nm immersion lithography), for example.

Next, in step 110, the wafer W on which the resist marks RPX and RPYB illustrated in FIG. 6A have been formed is transported to the polymer treatment device 500, and a polymer layer 56 that contains a block copolymer (BCP) is formed (coated) on the wafer W covering the resist marks RPX, RPYB, RPX1, RPYB1, and the like as well as the resist patterns for forming the device patterns (not illustrated in the figure) by spin coating process, for example. In the present embodiment, a diblock copolymer (PS-b-PMMA) of polystyrene (PS) and polymethyl methacrylate (PMMA) is used for the block copolymer, for example. Moreover, the polymer layer 56 is the block copolymer, but the polymer layer 56 may also contain a solvent to enhance the coating properties and/or additives or the like for facilitating self-assembly. The spin coating builds up the polymer layer 56 in recesses 70A and the like between the plurality of protruded guide patterns 54B and 54B1 that form the resist marks RPX and RPYB and the like (see FIGS. 4B, 4C, and 6C).

Figure 4D:
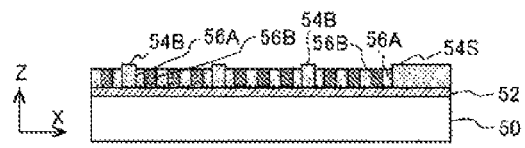

Next, the wafer W on which the polymer layer 56 has been formed is transported to the annealing device 600, and the polymer layer 56 is annealed (thermally annealed, for example) to make the polymer layer 56 undergo directed self-assembly (DSA) and separate into two types of domains (step 112). As illustrated in FIGS. 4D and 7A, this directed self-assembly causes the polymer layer 56 to phase separate into lyophilic first domains 56A made from long, thin, line-shaped polymethyl methacrylate (PMMA) regions that run in the Y direction and lyophobic second domains 56B made from long, thin, line-shaped polystyrene (PS) regions that run in the Y direction that are arranged in the X direction with a pitch p3a between the plurality of long, thin guide patterns 54B that run in the Y direction. The guide patterns 54B (resist patterns) are lyophilic, and therefore the lyophilic domains 56A are formed adjacent to the guide patterns 54B. The pitch p3a is approximately one severalth to one several tenth of the pitch p3 of the plurality of guide patterns 54B, for example, and the widths of the two types of domains 56A and 56B in the X direction are substantially equal to one another. The polymer layer 56 also phase separates into first and second domains between the plurality of guide patterns 54B1 of the second wafer mark WM2. In the present embodiment, the polymer layer 56 separates into two types of long, thin domains that run parallel to the long, thin guide patterns 54B and 54B1. Therefore, during the annealing of the polymer layer 56 (wafer W), conditions that facilitate separation of the polymer layer 56 into two types of long, thin domains are used.

Figure 4E:
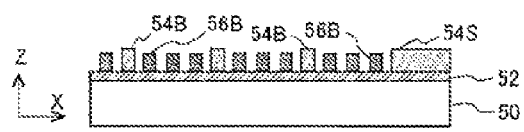
Figure 4F:
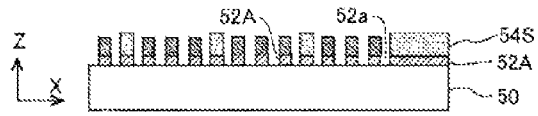
Figure 4G:
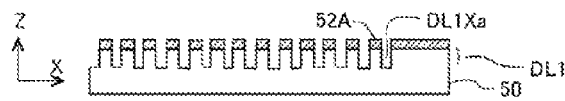

Next, the wafer W is transported to the etching device 400 and oxygen plasma etched, for example, to selectively remove the lyophilic first domains 56A of the domains 56A and 56B formed on the wafer W, as illustrated in FIGS. 7B and 4E (step 114). Then, the resist marks RPX and RPYB (the guide patterns 54B), the resist marks RPX1 and RPYB1 (the guide patterns 54B 1), and the periodically remaining lyophobic domains 56B are used as a mask while etching the hard mask layer 52 of the wafer W to form a plurality of openings 52a in the hard mask layer 52 (see FIG. 4F), and then the remaining resist and domains 56B are removed (step 116). Next, the first device layer DL1 of the wafer W is etched through the hard mask layer 52 in which the plurality of openings 52a are formed. As illustrated in FIG. 4G, this etching process forms a plurality of long, thin recesses DL1Xa that run in the Y direction in regions of the device layer DL1 corresponding to the domains 56A (first half of step 118).

Figure 4H:
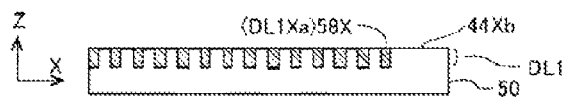

Furthermore, the wafer W is transported to the thin film forming device 300, where the recesses DL1Xa in the device layer DL1 of the wafer W are filled with a metal (such as copper). As illustrated in FIG. 4H, this forms long, thin line patterns 58X that run in the Y direction (second half of step 118). As illustrated in FIG. 7C, the plurality of line patterns 58X are arranged in the X direction with a pitch p3a, and the line width of the line patterns 58X is approximately half of the pitch p3a. Similarly, as illustrated in FIG. 10C, a plurality of metal line patterns 58X 1 arranged in the X direction with a pitch p3Aa are formed in the line pattern regions 44Xa1 for the first wafer mark WM2 in the device layer DL1 of the wafer W, and the space pattern regions 44Xb1 are the substrate left as-is.

As illustrated in FIG. 8, in the steps described above the first wafer mark WM1 that includes the wafer marks 44X, 44YA, and 44YB is formed in the scribe line regions SL of the first device layer DL1 of the wafer W. In other words, the X axis wafer mark 44X that includes the line pattern regions 44Xa in which the plurality of metal line patterns 58X are arranged in the X direction approximately with a pitch p3a and the space pattern regions 44Xb made from substrate patterns (foundation pattern) arranged in the X direction with a pitch p1 is formed. Furthermore, the two Y axis wafer marks 44YA and 44YB that include the line pattern regions 44Ya in which the line patterns 58X (that are shorter than the line patterns 58X of the wafer mark 44X) are arranged in the X direction approximately with a pitch p3a and the space pattern regions 44Yb made from substrate patterns arranged in the Y direction with a pitch p2 (here, p2 is equal to p1) are formed on either side of the wafer mark 44X in the Y direction. Similarly, the second wafer mark WM2 illustrated in FIG. 2B is formed.

Moreover, at the same time that the first wafer mark WM1 illustrated in FIG. 8 is formed, the L&S patterns 40X and 40Y illustrated in FIG. 2B are formed in each shot region SA of the wafer W using directed self-assembly of the polymer layer that contains the block copolymer using the same method used for the wafer mark.

Next, if a second device layer will be formed on top of the device layer DL1 of the wafer W, a thin film is formed on top of the device layer DL1 of the wafer W and coated with resist (step 120). Then, a reticle R2 is loaded onto the reticle stage RST of the exposure device 100, and the wafer W is loaded onto the wafer stage WST (step 122). Furthermore, the wafer alignment system ALS of the exposure device 100 detects the positions of a plurality of pairs of wafer marks WM1 and WM2 (see FIG. 2B) formed around a plurality of shot regions (so-called alignment shots) selected from all the shot regions SA of the wafer W, respectively. When approximately 100 shot regions SA are formed on the wafer W, for example, approximately 20 alignment shots are selected in one example. The plurality of pairs of wafer marks WM1 and WM2 formed around these alignment shots include a plurality of pairs of wafer marks WM1 and WM2 formed in scribe line regions SL that are formed at different distances from the center of the wafer W in the radial direction.

Next, a processing unit (not illustrated in the figure) that processes the detection signals from the wafer alignment system ALS determines whether the detection signal measured for each wafer mark WM1 and WM2 is acceptable or unacceptable. Here, an example of a method for determining whether the detection signal for the X axis wafer mark 44X of the first wafer mark WM1 illustrated in FIG. 12A is acceptable or unacceptable will be described. The same method is used to determine whether the X axis wafer mark 44X1 of the second wafer mark WM2 is acceptable or unacceptable.

More explanation will be made regarding the acceptable/unacceptable determination. In the present embodiment, the wafer W is spin-coated with the polymer layer 56 that contains the block copolymer, in step 110. It is expected that this spin coating process tends to cause the polymer layer 56 to be formed more thinly as the distance from the center of the wafer W in the radial direction increases.

The present inventor formed water marks on the surface of a wafer having a diameter of 300 mm using the mark forming method described above but without forming the guide patterns in the resist patterns for the wafer marks and while also changing the thickness of the polymer layer 56. The present inventor then measured the width (hereinafter, referred to as "line width CD" (critical dimension)) of the line pattern regions of the resulting wafer marks using a scanning electron microscope (SEM). The design value for this line width CD is approximately 1 µm.

FIG. 11 shows the line width CD measurement results. In FIG. 11, the horizontal axis is the position r (in mm) of the measured wafer marks from the center of the wafer in the radial direction and in the opposite direction. Moreover, the solid curve B1 represents the line width CD measurement results for a thin polymer layer 56, and the dashed curve B2 represents the line width CD measurement results for a thick polymer layer 56. The maximum value of the curve B1 is approximately equal to the design value for the line width CD. As shown by the curve B2, when the polymer layer 56 is thicker, the line width CD exhibits large variations as a result of the large number of microstructures are formed due to directed self-assembly of the polymer layer 56 in the pattern in the region where the guide patterns are not formed. Furthermore, the curves B1 and B2 show that the difference between the line width CD and the design value due to directed self-assembly of the polymer layer 56 tends to decrease as moving away from the center of the wafer in the radial direction. This implies that the polymer layer 56 tends to become thinner as moving away from the center of the wafer in the radial direction.

It is expected that the trend in which the polymer layer 56 tends to become thinner as moving away from the center of the wafer in the radial direction may also occur in the pattern forming method of the present embodiment. In this case, the shape (line width, straightness, pitch, or the like) of the plurality of line patterns 58X in the line pattern regions 44Xa of the wafer mark 44X of the first wafer mark WM1 illustrated in FIG. 8 as well as the shape of the plurality of line patterns 58X1 in the line pattern regions 44Xa1 of the wafer mark 44X1 of the second wafer mark WM2 illustrated in FIG. 10C, for example, will change according to distance from the center of the wafer W. As a result, the image signals of the wafer marks WM1 and WM2 may change according to the distance from the center of the wafer W, thereby potentially causing a large offset between the detection result for position detection and target value for some marks. Therefore, in the present embodiment, wafer marks WM1 and WM2 for which the detection signals have changed by more than an allowable range due to irregularities in the thickness of the polymer layer 56 due to spin coating, for example, are not used for alignment. Furthermore, the feature described below is obtained to determine whether those detection signals have changed by more than an allowable range.

The wafer alignment system ALS of the present embodiment is an image processing system and captures an image of the wafer mark 44X to obtain an image signal DSX as illustrated in FIG. 12B as the detection signal. The horizontal axis of FIG. 12B represents the positions of a plurality of pixels arranged in a direction corresponding to the measurement direction (here, the X direction) of the image sensor of the wafer alignment system ALS.

The processing unit of the wafer alignment system ALS detects the following quantities (a1) to (a11), for example, as characteristic quantities of the image signal DSX. In the following description, a portion corresponds to the pitch p1 (or p1A) formed by the line pattern regions 44Xa and the space pattern regions 44Xb of the wafer mark 44X (or 44X1) is referred to as a "mark unit". Moreover, the characteristic quantities of the Y axis wafer marks 44YA and 44YB are detected in the same manner.

(a1) The intervals pm1, pm2, and pm3 in the X direction between the positions of the maximum values (the values at the positions indicated by the arrows A1 to A4) of the image signal from the image of a plurality of mark units (the regions that include the line pattern regions 44Xa—here, there are four mark units) of the wafer mark 44X or the like.

(a2) The maximum value pmmax and minimum value pmmin of those intervals pm1 to pm3.

(a3) The difference $\delta$pm1 between the average value pm of the intervals pm1 to pm3 and a design value pmx.

(a4) The difference $\delta$pm2 between the maximum value pmmax and the minimum value pmmin of the intervals pm1 to pm3, and the contrast (amplitude/average value) of the image signal in the region where the wafer mark 44X or the like is formed.

(a5) The maximum value and the minimum value of the image signal in the region where the image of the wafer mark 44X or the like is formed.

(a6) The average value imax of the maximum values imax1 and the like (the values at the positions indicated by the arrows A1 to A4) of the image signals for the images of the plurality of mark units of the wafer mark 44X or the like.

(a7) The average value imin of the minimum values imin1 and the like of the image signals for the images of the plurality of mark units of the wafer mark 44X or the like.

(a8) The difference between the average value imax and the average value imin.

(a9) The average value of the maximum magnitude of slopes (the amount of change in the image signal for a given change in position in the X direction) of the image signals for the images of the plurality of mark units.

As illustrated in FIG. 11C, this value may be obtained by obtaining a differentiated signal dDSX/dx of the image signal DSX, obtaining the absolute value SLL1 of the maximum positive value of that differentiated signal and the absolute value SLR1 of the maximum negative value of that differentiated signal for the image of each mark unit (line pattern region 44Xa and space pattern region 44Xb), and then calculating the average value of the larger of each pair of absolute values (the maximum value for each mark unit).

(a10) The difference between the maximum value and the minimum value of the slope of the image signal for the images of the plurality of mark units.

(a11) The average value of the difference between the absolute value SLL1 or the like of the positive slope and the absolute value SLR1 or the like of the negative slope of the image signal for the images of the plurality of mark units.

Then, for each characteristic quantity (a1) to (a11) obtained for the measured plurality of pairs of wafer marks WM1 and WM2, the processing unit calculates the differences between the characteristic quantities and prescribed target values (the average values of the characteristic quantities as calculated for wafer marks formed in a state that the polymer that contains the block copolymer is not coated, for example). If these differences exceed standard values defined for each characteristic quantity, the processing unit determines that the detection signal for the corresponding wafer mark is unacceptable. The processing unit may also determine that the detection signal for the wafer mark is unacceptable if a certain percentage (such as more than 50%) of these differences exceed the corresponding standard values. Furthermore, detecting only at least one of the characteristic quantities (a1) to (a11) may be sufficient.

Next, in step 128, the processing unit determines whether the number of wafer marks WM1 and WM2 for which the detection signals have been determined to be acceptable is greater than or equal to a prescribed number (here, the number at which the required alignment precision is achieved). It should be noted that if the detection signal for at least one mark in each pair of wafer marks WM1 and WM2 is determined to be acceptable, then the detection signal for the pair of wafer marks WM1 and WM2 is also acceptable. Furthermore, if the number of wafer marks for which the detection signals have been determined to be acceptable is less than the prescribed number, the flow proceeds to step 132, where detection conditions such as the detection light wavelength of the wafer alignment system ALS, the polarization, and the numerical aperture of the image forming optical system are changed. The flow then returns to step 124, and the subsequent processing after the detection of the alignment shot wafer marks is repeated. Note that the alignment shot (the positions of the wafer marks to be measured) may also be changed instead of changing the detection conditions or in addition to changing the detection conditions.

Moreover, in step 128, if the number of wafer marks WM1 and WM2 for which the detection signals have been determined to be acceptable is greater than or equal to the prescribed number, the flow proceeds to step 130. In step 130, marks to be used for alignment are selected from the plurality of pairs of wafer marks WM1 and WM2 for which the detection signals have been determined to be acceptable, the arrangement coordinates for each shot region on the wafer W are determined, for example using the enhanced global alignment (EGA) method using the positions measured related to the selected marks and, and the wafer W is aligned. Note that when both marks in a given pair of wafer marks WM1 and WM2 are determined to be acceptable, the detection result from the wafer mark WM1 which has a smaller pitch may be used, for example. Alternatively, the detection result for the wafer mark WM1 or WM2 for which the sum of squared differences of the characteristic quantities of the detection signal relative to the standard values is smallest may be used.

Then, each shot region SA of the wafer W is exposed with the image of the pattern of the reticle R2 (step 134). In the following processes (step 136), pattern formation such as developing and etching the resist is performed to form the pattern for the second device layer.

In this way, the pattern forming method of the present embodiment makes it possible to form L&S patterns 40X and 40Y that include structures smaller (finer) than the resolution limit of immersion lithography in each shot region SA of the wafer W by using directed self-assembly of the polymer layer that contains the block copolymer and also makes it possible to form, in the scribe line regions SL, wafer marks WM1 and WM2 that include structures that can be detected by the wafer alignment system ALS. Therefore, the wafer W can be aligned with high precision in subsequent processes. Moreover, if the detection signal for one of the wafer marks WM1 and WM2 is determined to be unacceptable, the wafer W can be aligned with higher precision by using another wafer mark for which the detection signal has been determined to be acceptable.

As described above, the mark forming method implemented using the pattern forming system of the present embodiment includes: step 106 in which the scribe line regions SL (mark formation regions) of the wafer W are exposed with the images of mark patterns 46X and 46X1 step 108 in which the resist marks RPX and RPX1 (first and second marks) that have different shapes than one another are formed in the scribe line regions SL based on those mark images; and step 110 in which the scribe line regions SL and shots SA of the wafer W are spin-coated with the polymer layer 56 that contains the block copolymer. The mark forming method also includes: step 112 in which self-assembled regions (the lyophilic domains 56A and the lyophobic domains 56B) are formed in at least a portion of the applied polymer layer 56 by annealing; step 114 in which self-assembled regions (the domains 56A) are partially and selectively removed by plasma etching; and steps 116 and 118 in which the wafer marks 44X and 44X1 of the first and second wafer marks WM1 and WM2 are formed in the scribe line regions SL of the wafer W using the resist marks RPX and RPX1, respectively.

This mark forming method makes it possible to form the wafer marks 44X and 44X 1 that include structures with a pitch smaller (finer) than the resolution limit of immersion lithography and structures with a pitch greater than or equal to the detection limit of the wafer alignment system ALS, thereby making it possible to form the wafer marks WM1 and WM2, during a formation of circuit patterns using self-assembly of the polymer layer 56 that contains the block copolymer.

Furthermore, the mark detecting method of the present embodiment for detecting the first and second wafer marks WM1 and WM2 for positioning (or alignment) formed in the scribe line regions SL of the wafer W using the mark forming method of the present embodiment includes: step 124 in which detection signals (image signals) of the first and second wafer marks WM1 and WM2 are generated; step 126 in which those generated detection signals are evaluated; and step 130 in which the marks to use for positioning the wafer W are selected from the first and second wafer marks WM1 and WM2 on the basis of those evaluation results.

This mark detecting method makes it possible to position (align) the wafer W with high precision even if the detection signal for one mark of the wafer marks WM1 and WM2 differs from a target state due to factors such as the degree of self-assembly of the polymer layer 56 that contains the block copolymer, by using the detection signal for another mark.

Furthermore, modifications such as the following may be made to the embodiment described above.

In the embodiment described above, a plurality of guide patterns 54B and 54B1 are formed in the line regions RPXa and RPXa1 of the resist marks RPX and RPX1 for the wafer marks WM1 and WM2, and the polymer layer 56 undergoes directed self-assembly inside the recesses 70A or the like between guide patterns 54B and between guide patterns 54B1. However, the width of the line regions (recesses) for at least one mark of the wafer marks WM1 and WM2 may be increased so that the polymer layer 56 does not undergo substantial directed self-assembly in that line region.

Figure 13A:
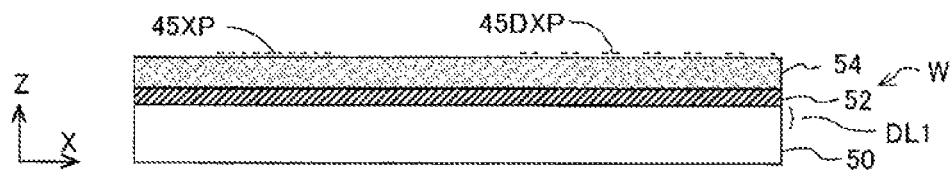
Figure 13B:
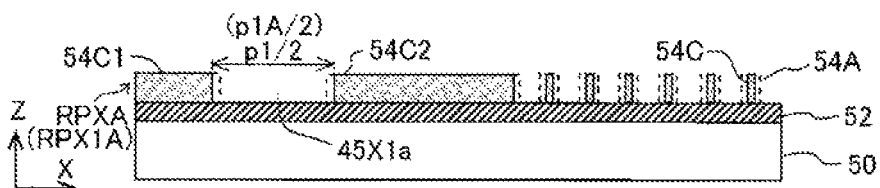

In this modification example, as illustrated in FIG. 13A, a resist layer 54 of a wafer W is exposed with an image 45XP for a wafer mark and an image 45DXP for a device pattern. Then, as illustrated in FIG. 13B, the resist layer 54 is developed to form the resist pattern 54A illustrated by the dotted lines. Next, the resist pattern 54A is slimmed to form a plurality of guide patterns 54C in the device pattern region. In the wafer mark region, recesses 45X1$a$ that correspond to the line pattern regions and have a width p1/2 (or p1A/2) are formed sandwiched between resist patterns 54C1 and 54C2 (protrusions). p1 (or p1A) is the pitch of that wafer mark.

Figure 13C:
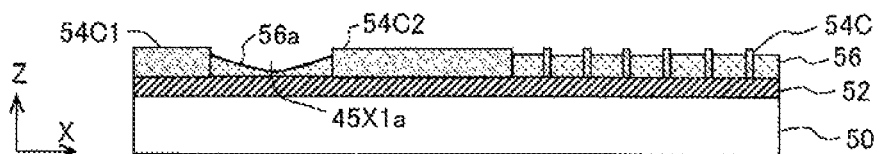

Then, as illustrated in FIG. 13C, a polymer layer that contains a block copolymer is applied to form a polymer layer 56 between the guide patterns 54C. In the wide recess 45X1$a$, a polymer layer 56$a$ is applied so as to be thinner in the center portion of the recess 45X1$a$, for example. Next, directed self-assembly is induced in the polymer layer 56 to cause directed self-assembly between the guide patterns 54C, thereby making it possible to form fine patterns like in the embodiment described above. In contrast, the polymer layer 56$a$ in the wide recess 45X1$a$ for the wafer mark does not undergo substantial directed self-assembly, and therefore in subsequent processes, an opening is formed at a position of a hard mask layer 52 corresponding to the recess 45X1$a$.

Figure 13D:
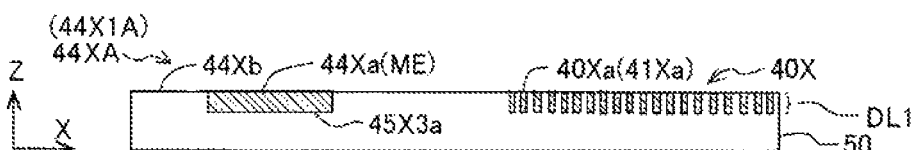

Then, as illustrated in FIG. 13D, the pattern formation process is completed with the resulting device pattern that includes an L&S pattern 40X in which a plurality of fine line patterns 40Xa fill recesses 41Xa and wafer mark 44XA (or 44X1A) that includes line pattern regions 44Xa in which recesses 45X3$a$ that correspond to the recesses 45X1$a$ are filled with a metal ME and space pattern regions 44Xb made from the substrate that are arranged in the X direction with a pitch p (or p1A). This wafer mark 44XA (or 44X1A) can also be detected by the wafer alignment system ALS of the exposure device 100.

In this modification example, if first and second domains are formed to a slight degree in the peripheral portions of the polymer layer 56$a$ in the recess 45X1$a$ for the wafer mark illustrated in FIG. 13C, and protrusions that correspond to the second domains are formed on the hard mask layer 52, the finally-formed wafer mark 44XA or the like will include small (fine) line-shaped patterns (patterns having unnecessary microstructures due to the block copolymer) in the line pattern regions 44Xa. As a result, the waveform of the image signal DSX illustrated in FIG. 12B is different for each line pattern region 44Xa. Furthermore, if the area ratio of the patterns that have the unnecessary microstructures is large, it is expected that the differences between the maximum values and minimum values in the intervals pm1 to pm3 of the image signal DSX, for example, will also be large. Therefore, the amount of the pattern in which the unnecessary microstructures are formed can be estimated using the increases in those differences relative to a prescribed target value (the average value of the differences as calculated for wafer marks formed on a wafer in a state that the wafer is not coated with the polymer that contains the block copolymer, for example).

Moreover, if the increase in those differences relative to that prescribed target value exceeds a certain value, it can be determined that mark portions formed by portions (the second domains) formed by removing at least a portion of the self-assembled regions in the polymer layer 56$a$ (the first domains) remain in the recesses 45X1$a$ for that wafer mark in the scribe line region SL (mark formation region). Wafer marks 44XA or the like for which it is determined that such mark portions remain may be excluded from the measurement targets Furthermore, in the embodiments described above, the configurations of the wafer marks WM1 and WM2 are not limited to the configuration illustrated in FIG. 2B, and the X axis wafer marks and the Y axis wafer marks may be formed at different positions in the scribe line regions SL, for example.

In addition, in the embodiments described above, two types of marks (the wafer marks WM1 and WM2) are used. However, three or more types of marks may be formed around each shot of the wafer as the wafer marks.

Moreover, in the embodiments described above, image processing is used for the wafer mark detecting method, but any detection method may be used. For example, a laser step alignment (LSA) system in which the wafer marks are irradiated with laser light and the resulting diffracted light produced by the wafer marks is detected to detect the position of those wafer marks, or the like, may be used.

Furthermore, in the embodiments described above, the device patterns are line patterns. However, the pattern forming method of the embodiment described above can also be used when the device patterns include hole arrays that include a large number of small holes (via holes or through holes) arranged periodically in the X and Y directions.

Next, when the pattern forming method of the embodiments described above is used to manufacture a semiconductor device (electronic device) such as an SRAM device, the semiconductor device is manufactured using steps such as those illustrated in FIG. 14: step 221 in which the features (functions) and performance of the semiconductor device are designed; step 222 in which a mask (reticle) based on that design step is produced; step 223 in which a substrate (or wafer base material) for the semiconductor device is produced; step 224 in which the substrate is treated; step 225 in which the device is assembled (which includes manufacturing processes such as dicing, bonding, and packaging); and inspecting step 226. Note that the pattern forming method of the embodiments described above is included in the substrate treatment step 224. The pattern forming method includes processes such as exposing the substrate with the reticle pattern using an exposure device, developing the exposed substrate, and heating (curing) and etching the developed substrate.

In other words, this device manufacturing method includes the substrate treatment step 224, and the substrate treatment step 224 includes a process in which the pattern forming method of any one of the embodiments described above is used to form device patterns and wafer marks on the substrate.

This device manufacturing method makes it possible to use an exposure device to manufacture, with high precision, a semiconductor device with circuit patterns smaller than the resolution limit of the exposure device.

Note that a device to be manufactured in the embodiments described above may be any type of semiconductor device, including, for example, a dynamic RAM (DRAM), a central processing unit (CPU), and a digital signal processor (DSP) other than an SRAM. Furthermore, the pattern forming method of the embodiments described above may be used in manufacture of electronic devices (microdevices) such as image sensors and microelectromechanical systems (MEMS) other than semiconductor devices.

Moreover, in the embodiments described above, a dry exposure device other than an immersion exposure device may be used. Furthermore, other than an exposure device that uses ultraviolet exposure light, an extreme ultraviolet (EUV) exposure device that uses, as exposure light, EUV light with a wavelength of a several nm to several tens of nm or an electron beam exposure device that uses electron beams as exposure light may be used.

Moreover, in the embodiments described above, a PS-b-PMMA diblock copolymer is used for the block copolymer. Examples of other compounds that can be used for the block copolymer include: poly(styrene-b-vinylpyridine), poly(styrene-b-butadiene), poly(styrene-b-isoprene), poly(styrene-b-methyl methacrylate), poly(styrene-b-alkenyl aromatic), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methyl methacrylate-b-dimethylsiloxane), diblock copolymers or triblock copolymers of combinations that include at least one of the above block copolymers, or the like. Furthermore, a random copolymer may be used for the block copolymer.

It is preferable that the block copolymer exhibit an overall molecular weight and dispersity that allow further treatments to be performed.

Moreover, when applying the polymer layer containing the block copolymer, a solvent casting method in which a solution produced by dissolving the polymer layer in a solvent is applied and the solvent is then vaporized, for example, may also be used. In this case, the solvents that can be used are different depending on the ingredients of the block copolymer and the solubility of any additives if used. Representative examples of casting solvents for such ingredients and additives include propylene glycol monomethyl ether acetate (PGMEA), ethoxyethyl propionate, anisole, ethyl lactate, 2-heptanone, cyclohexanone, amyl acetate, γ-butyrolactone (GBL), toluene, or the like.

Furthermore, examples of additives that can be added to the polymer layer that contains the block copolymer can be selected from a group including: additive polymers (such as homopolymers, star-shaped polymers and copolymers, hyperbranched polymers, block copolymers, graft copolymers, hyperbranched copolymers, random copolymers, crosslinked polymers, and inorganic compound-containing polymers); small molecules; nanoparticles; metal compounds; inorganic compound-containing molecules; surfactants; photoacid generators; thermal acid generators; base quenchers; hardening agents; crosslinking agents; chain extenders; or combinations that include at least one of the abovementioned additives. Here, one or more additives associate with the block copolymer to form one or more portion(s) of self-assembled domain(s).

The present invention is not limited to the embodiments described above, and various configurations may be made without departing from the spirit of the present invention.

According to the above embodiments, first and second positioning marks are formed using first and second marks that have different shapes than one another, thereby making it possible to form at least one positioning mark with a desired (target) shape even when a block copolymer undergoes self-assembly. This makes it possible to form the positioning marks at the same time as circuit patterns when forming circuit patterns using self-assembly of a block copolymer.

What is claimed is:

1. A mark forming method for forming a mark comprising:
    forming a first pattern and a second pattern arranged at a first interval, and a third pattern and a fourth pattern arranged at a second interval different from the first interval, in an area on a substrate different from an area in which a device pattern is to be formed;
    applying a block copolymer to the substrate after the first, second, third and fourth patterns are formed;
    applying a self-assembly treatment to the applied block copolymer; and
    etching the substrate using the block copolymer to which the self-assembly treatment has been applied as a mask.

2. The mark forming method according to claim 1, wherein
    the block copolymer between the first pattern and the second pattern, and/or the block copolymer between the third pattern and the fourth pattern are/is used to form the mark on the substrate.

3. The mark forming method according to claim 1, further comprising:
    removing a portion of the block copolymer between the first pattern and the second pattern and between the third pattern and the fourth pattern, wherein
    the block copolymer that is not removed and is left remaining is used to form the mark on the substrate.

4. The mark forming method according to claim 1, wherein the mark is formed in a scribe line of the substrate.

5. A device manufacturing method comprising:
    forming alignment marks on a substrate using the mark forming method as defined in claim 1; and
    performing an alignment using the alignment marks and exposing the substrate.

6. The mark forming method according to claim 1, wherein
    the second pattern and the third pattern are different from each other.

7. The mark forming method according to claim 1, further comprising
    judging whether the mark is appropriate for use as an alignment mark.

8. A mark forming method comprising:
    forming a first pattern and a second pattern arranged at a first interval, and a third pattern and a fourth pattern arranged at a second interval different from the first interval, in an area on a substrate different from an area in which a device pattern is to be formed;
    applying a block copolymer to the substrate after the first, second, third and fourth patterns are formed;

applying a self-assembly treatment to the applied block copolymer; and forming a mark between the first pattern and the second pattern and forming a mark between the third pattern and the fourth pattern, after the self-assembly treatment.

9. The mark forming method according to claim 8, further comprising:

removing a portion of the block copolymer between the first pattern and the second pattern and between the third pattern and the fourth pattern, wherein the block copolymer that is not removed and is left remaining is used to form the mark on the substrate.

10. The mark forming method according to claim 8, wherein the mark is formed in a scribe line of the substrate.

11. A device manufacturing method comprising:

forming alignment marks on a substrate using the mark forming method as defined in claim 8; and performing an alignment using the alignment marks and exposing the substrate.

12. The mark forming method according to claim 8, wherein the second pattern and the third pattern are different from each other.

13. The mark forming method according to claim 8, further comprising judging whether the mark is appropriate for use as an alignment mark.

14. A mark forming method, comprising:

exposing a region, of a substrate, including a mark formation region with a mask image to form a first mark and a second mark in the mark formation region based on a first portion of the mask image, the first mark and the second mark having shapes different than one another;

applying a polymer layer containing a block copolymer to the region including the mark formation region;

forming self-assembled regions in at least a portion of the applied polymer layer;

selectively removing a portion of the formed self-assembled regions;

forming a first positioning mark in the mark formation region of the substrate using the first mark; and forming a second positioning mark in the mark formation region of the substrate using the second mark.

15. The mark forming method according to claim 14, wherein the first mark includes a plurality of first line patterns formed periodically in a first direction inside a first recess; wherein the second mark includes a plurality of second line patterns formed periodically in the first direction inside a second recess; wherein arrangement pitches of the first line patterns and the second line patterns are different and/or heights of the first line patterns and the second line patterns are different; and wherein self-assembled regions of the polymer layer are formed in regions between the plurality of first line patterns of the first mark and in regions between the plurality of second line patterns of the second mark, and a portion of the formed self-assembled regions are removed selectively.

16. The mark forming method according to claim 14, wherein the first mark and the second mark have shapes in which self-assembled regions are substantially not formed in the polymer layer that contains the block copolymer.

17. The mark forming method according to claim 16, wherein the first mark includes a first recess having a width at which a self-assembled region is substantially not formed in the polymer layer that contains the block copolymer; and wherein the second mark includes a second recess having a width greater than the width of the first recess.

18. The mark forming method according to claim 14, wherein the first and second positioning marks are formed in a plurality of mark formation regions at different distances from a center of the substrate in a radial direction.

19. The mark forming method according to claim 14, wherein exposing the region, of the substrate, including the mark formation region with the mask image includes exposing a device pattern formation region of the substrate adjacent to the mark formation region with the mask image; wherein a first pattern in which self-assembled regions in the polymer layer that contains the block copolymer are formed is formed in the device pattern formation region based on a second portion of the mask image different from the first portion at the same time that the first mark and the second mark are formed in the mark formation region of the substrate; and wherein a second pattern is formed in the device pattern formation region of the substrate using the self-assembled regions that have been partially and selectively removed, at the same time that the first and second positioning marks are formed in the mark formation region of the substrate using the first mark and the second mark.

20. The mark forming method according to claim 19, wherein the first pattern includes a recess having a width that allows self-assembled regions to be formed in the polymer layer that contains the block copolymer.

21. A device manufacturing method comprising:

forming alignment marks on a substrate using the mark forming method as defined in claim 14; and performing an alignment using the alignment marks and exposing the substrate.

22. A mark detecting method for detecting the first and second positioning marks formed in a mark formation region of a substrate using the mark forming method as defined in claim 14, the mark detecting method comprising:

generating detection signals for the first and second positioning marks;

evaluating the generated detection signals; and selecting a mark to use for positioning the substrate from the first and second positioning marks based on the evaluation result.

23. The mark detecting method according to claim 22, wherein the detection signals for the first and second positioning marks include first and second image signals corresponding to images of the first and second positioning marks, respectively; and wherein evaluating the generated detection signals includes:

extracting signal characteristic quantity from the first image signal and signal characteristic quantity form the second image signal; and comparing the extracted signal characteristic quantities of the first and second image signals to a standard value.

24. The mark detecting method according to claim 23, wherein
the extracted signal characteristic quantities include at least one of a contrast of the image signal on a pixel basis, a distance between periodic portions of the image signal, a maximum value and a minimum value of the image signal in a measurement region, and a magnitude of a slope of the image signal.

25. A device manufacturing method comprising:
forming a first pattern and a second pattern in a first area, on a substrate, in which a device pattern is to be formed;
forming a third pattern and a fourth pattern arranged at a first interval and a fifth pattern and a sixth pattern arranged at a second interval different from the first interval in a second area, on the substrate, which is different from the first area;
applying a block copolymer to the substrate after the first, second, third, fourth, fifth and sixth patterns are formed;
applying a self-assembly treatment to the applied block copolymer; and
forming an alignment mark at a position between the third pattern and the fourth pattern and/or at a position between the fifth pattern and the sixth pattern, after the self-assembly treatment.

26. The device manufacturing method according to claim 25, wherein
the forming the alignment mark includes:
removing a part of the block copolymer to which the self-assembly treatment has been applied; and
processing the substrate using the block copolymer from which the part of the block copolymer has been removed as a mask.

27. The device manufacturing method according to claim 25, wherein
the applying the self-assembly treatment to the applied block copolymer includes applying the self-assembly treatment to the block copolymer applied in an area between the first and second patterns,
the device manufacturing method further comprising:
removing a part of the block copolymer in the area between the first and second patterns after the self-assembly treatment, and
forming a device pattern on the substrate using the block copolymer from which the part of the block copolymer has been removed as a mask.

28. The device manufacturing method according to claim 25, wherein
the fourth pattern and the fifth pattern are different from each other.

* * * * *